United States Patent
Huang et al.

(10) Patent No.: US 11,139,770 B2
(45) Date of Patent: Oct. 5, 2021

(54) GATE DRIVING CIRCUIT APPLIED TO MOTOR INVERTER AND GATE DRIVING METHOD

(71) Applicant: Chicony Power Technology Co., Ltd., New Taipei (TW)

(72) Inventors: Chung-Wei Huang, New Taipei (TW); Chu-Chen Yang, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 88 days.

(21) Appl. No.: 16/828,549

(22) Filed: Mar. 24, 2020

(65) Prior Publication Data

US 2021/0242817 A1  Aug. 5, 2021

(30) Foreign Application Priority Data

Jan. 30, 2020  (TW) .................. 109102888

(51) Int. Cl.
*H02P 27/08* (2006.01)
*H02K 11/33* (2016.01)
(Continued)

(52) U.S. Cl.
CPC .............. *H02P 27/08* (2013.01); *H02K 11/33* (2016.01); *H02M 1/08* (2013.01); *H02P 6/085* (2013.01);
(Continued)

(58) Field of Classification Search
CPC .. H02P 27/08; H02P 6/085; H02P 1/00; H02P 1/445; H02P 27/06; H02P 1/04;
(Continued)

(56) References Cited

U.S. PATENT DOCUMENTS

| 4,727,465 A | 2/1988 | Cini et al. |
| 9,041,433 B2 | 5/2015 | Ausseresse et al. |

(Continued)

FOREIGN PATENT DOCUMENTS

| CN | 104737439 A | 6/2015 |
| CN | 109546916 A | 3/2019 |

(Continued)

*Primary Examiner* — Antony M Paul
(74) *Attorney, Agent, or Firm* — Innovation Capital Law Group; Vic Lin

(57) ABSTRACT

A gate driving circuit applied to motor inverter includes first power switch circuit, first and second bootstrap fast charging circuits, and first, second and third capacitors. The first power switch circuit includes first and second power switches. The first bootstrap fast charging circuit is electrically connected to the first power switch. The second bootstrap fast charging circuit is electrically connected to the second power switch. The first capacitor is electrically connected to the first power switch. The second capacitor is electrically connected to the first bootstrap fast charging circuit and first insulated switch. The third capacitor is electrically connected to the second bootstrap fast charging circuit and second insulated switch. When the first power switch is disabled and the second power switch is enabled, an independent power supply enables the second bootstrap fast charging circuit to charge the third capacitor to enable the second insulated switch.

19 Claims, 19 Drawing Sheets

(51) Int. Cl.
*H02M 1/08* (2006.01)
*H03K 17/60* (2006.01)
*H02P 6/08* (2016.01)
*H02M 1/00* (2006.01)

(52) U.S. Cl.
CPC .......... *H03K 17/60* (2013.01); *H02M 1/0006* (2021.05); *H03K 2217/0081* (2013.01)

(58) Field of Classification Search
CPC .......... H02P 21/00; H02K 11/33; H02M 1/08; H02M 2001/0006; H02M 7/53871; H02M 1/084; H02M 7/53875; H02M 7/53873; H02M 2007/53876; H02M 1/4233; H02M 3/07; H02M 3/18; H02M 3/22; H02M 5/08; H02M 7/42; H02M 7/5395; H02M 2007/4835; H03K 17/60; H03K 2217/0081
See application file for complete search history.

(56) References Cited

U.S. PATENT DOCUMENTS

| | | | |
|---|---|---|---|
| 9,954,422 | B2 | 4/2018 | Oljaca et al. |
| 10,784,797 | B1* | 9/2020 | Sedano ............. H02M 7/53875 |
| 2015/0249406 | A1* | 9/2015 | Koseki .................... H02M 1/08 |
| | | | 318/400.27 |

FOREIGN PATENT DOCUMENTS

| | | |
|---|---|---|
| TW | I482402 B | 4/2015 |
| TW | I577122 B | 4/2017 |
| TW | I645662 B | 12/2018 |
| WO | 2015107867 A1 | 7/2015 |
| WO | 2018181212 A1 | 10/2018 |

* cited by examiner

GATE DRIVING CIRCUIT APPLIED TO MOTOR INVERTER AND GATE DRIVING METHOD

CROSS-REFERENCE TO RELATED APPLICATION

This non-provisional application claims priority under 35 U.S.C. § 119(a) to Patent Application No. 109102888 filed in Taiwan, R.O.C. on Jan. 30, 2020, the entire contents of which are hereby incorporated by reference.

BACKGROUND

Technical Field

The present invention relates to a power supply circuit, and in particular, to a gate driving circuit applied to a motor inverter and a gate driving method.

Related Art

An integrated motor drive (IMD) mainly includes a motor and a motor inverter, where the motor is driven by the motor inverter to rotate. In addition, the motor inverter can also have a controller to control the rotational speed of the motor. The motor inverter in the integrated motor drive includes at least one power supply circuit to supply voltage, where the power supply circuits include a gate driving circuit to control an upper bridge switch and a lower bridge switch to change the polarity of a motor rotor or a motor stator so that the motor is controlled to operate. Generally, a common gate driving circuit includes a bootstrap circuit or a charge pump circuit.

However, when a three-phase motor is connected to a three-phase power supply, the gate driving circuit requires a plurality of gate independent power supplies. For example, in a power supply circuit of a three-phase three-wire motor, a three-phase gate driving circuit needs four gate independent power supplies to provide switching signals for a three-arm upper bridge switch and a three-arm lower bridge switch.

SUMMARY

In view of the above problems, the present invention aims to provide a gate driving circuit applied to a motor inverter and a gate driving method, so as to resolve the problem existing in the prior art that a plurality of independent power supplies are needed for power supply, and to achieve an effect that a three-phase three-wire voltage source inverter using six gate driving circuits needs only one independent power supply.

In an embodiment, a gate driving circuit applied to a motor inverter comprises a first power switch circuit, a first bootstrap fast charging circuit, a second bootstrap fast charging circuit, a first capacitor, a second capacitor, and a third capacitor. The first power switch circuit includes a first power switch and a second power switch. The first bootstrap fast charging circuit is electrically connected to the first power switch. The second bootstrap fast charging circuit is electrically connected to the second power switch. The first capacitor is electrically connected to the first power switch. The second capacitor is electrically connected to the first bootstrap fast charging circuit and a first insulated switch. The third capacitor is electrically connected to the second bootstrap fast charging circuit and a second insulated switch. When the first power switch is disabled and the second power switch is enabled, an independent power supply enables the second bootstrap fast charging circuit to charge the third capacitor to enable the second insulated switch.

In some embodiments, when the second insulated switch is turned on, the independent power supply charges the first capacitor.

In some embodiments, when the first power switch is enabled and the second power switch is disabled, the independent power supply enables, via the first capacitor, the first bootstrap fast charging circuit to charge the second capacitor to enable the first insulated switch.

In some embodiments, the first bootstrap fast charging circuit may include a charging switch. A control end of the charging switch is electrically connected, via the first power switch, to the independent power supply, a first end of the charging switch is electrically connected to the second capacitor, and a second end of the charging switch is electrically connected to the second insulated switch.

In some embodiments, the second bootstrap fast charging circuit may include a charging switch. A control end of the charging switch is electrically connected, via the second power switch, to the independent power supply, a first end of the charging switch is electrically connected to the third capacitor, and a second end of the charging switch is electrically connected to ground In some embodiments, the gate driving circuit may further include a second power switch circuit, a third bootstrap fast charging circuit, a fourth bootstrap fast charging circuit, a fourth capacitor, a fifth capacitor, and a sixth capacitor. The second power switch circuit has a third power switch and a fourth power switch. The third bootstrap fast charging circuit is electrically connected to the third power switch. The fourth bootstrap fast charging circuit is electrically connected to the fourth power switch. The fourth capacitor is electrically connected to the third power switch. The fifth capacitor is electrically connected to the third bootstrap fast charging circuit and a third insulated switch. The sixth capacitor is electrically connected to the fourth bootstrap fast charging circuit and a fourth insulated switch. When the third power switch is disabled and the fourth power switch is enabled, the independent power supply enables the fourth bootstrap fast charging circuit to charge the sixth capacitor to enable the fourth insulated switch.

In some embodiments, when the fourth insulated switch is turned on, the independent power supply charges the fourth capacitor In some embodiments, when the third power switch is enabled and the fourth power switch is disabled, the independent power supply enables, via the fourth capacitor, the third bootstrap fast charging circuit to charge the fifth capacitor to enable the third insulated switch.

In some embodiments, the third bootstrap fast charging circuit may include a charging switch. A control end of the charging switch is electrically connected, via the third power switch, to the independent power supply, a first end of the charging switch is electrically connected to the fifth capacitor, and a second end of the charging switch is electrically connected to the fourth insulated switch.

In some embodiments, the fourth bootstrap fast charging circuit may include a charging switch. A control end of the charging switch is electrically connected, via the fourth power switch, to the independent power supply, a first end of the charging switch is electrically connected to the sixth capacitor, and a second end of the charging switch is electrically connected to ground.

In some embodiments, the gate driving circuit may further include a third power switch circuit, a fifth bootstrap fast charging circuit, a sixth bootstrap fast charging circuit, a seventh capacitor, an eighth capacitor, and a ninth capacitor.

The third power switch circuit has a fifth power switch and a sixth power switch. The fifth bootstrap fast charging circuit is electrically connected to the fifth power switch. The sixth bootstrap fast charging circuit is electrically connected to the sixth power switch. The seventh capacitor is electrically connected to the fifth power switch. The sixth capacitor is electrically connected to the fifth bootstrap fast charging circuit and a fifth insulated switch. The seventh capacitor is electrically connected to the sixth bootstrap fast charging circuit and a sixth insulated switch. When the fifth power switch is disabled and the sixth power switch is enabled, the independent power supply enables the fifth bootstrap fast charging circuit to charge the ninth capacitor to enable the sixth insulated switch.

In some embodiments, the second power switch, the fourth power switch and the sixth power switch are enabled simultaneously; and during the enabling process, the second power switch, the fourth power switch and the sixth power switch are turned on simultaneously which occurs alternatively with a fact that the second power switch, the fourth power switch and the sixth power switch are turned off simultaneously.

In some embodiments, when the sixth insulated switch is turned on, the independent power supply charges the seventh capacitor.

In some embodiments, when the fifth power switch is turned on and the sixth power switch is turned off, the independent power supply enables, via the seventh capacitor, the fifth bootstrap fast charging circuit to charge the eighth capacitor to enable the fifth insulated switch In some embodiments, the fifth bootstrap fast charging circuit may include a charging switch. A control end of the charging switch is electrically connected, via the fifth power switch, to the independent power supply, a first end of the charging switch is electrically connected to the eighth capacitor, and a second end of the charging switch is electrically connected to the sixth insulated switch.

In some embodiments, the sixth bootstrap fast charging circuit may include a charging switch. A control end of the charging switch is electrically connected, via the sixth power switch, to the independent power supply, a first end of the charging switch is electrically connected to the ninth capacitor, and a second end of the charging switch is electrically connected to ground.

In an embodiment, a gate driving method includes: enabling a lower arm power switch; when the lower arm power switch is turned on, turning on a lower arm charging switch by an independent power supply via the lower arm power switch; when the lower arm charging switch is turned on, a first charging path being formed to charge a lower arm bootstrap capacitor by the independent power supply; enabling a lower arm insulated switch according to the potential of the lower arm bootstrap capacitor; when the lower arm insulated switch is turned on, the independent power supply, an upper arm pre-charging capacitor and the lower arm insulated switch forming a pre-charging path, to charge the upper arm pre-charging capacitor by the independent power supply; after the step of enabling the lower arm insulated switch, disabling the lower arm power switch and enabling an upper arm power switch; when the upper arm power switch is turned on, the upper arm pre-charging capacitor, an upper arm bootstrap capacitor and the upper arm power switch forming a second charging path, to charge the upper arm bootstrap capacitor; and enabling an upper arm insulated switch according to the potential of the upper arm bootstrap capacitor. The first charging path includes the lower arm bootstrap capacitor and the lower arm charging switch.

In some embodiments, the gate driving method may further include: before the step of enabling the lower arm power switch, charging a lower arm pre-charging capacitor by the independent power supply. The step of turning on a lower arm charging switch by the independent power supply via the lower arm power switch may include: releasing, by the lower arm pre-charging capacitor, the stored independent power supply to a control end of the lower arm charging switch. The first charging path further includes the lower arm pre-charging capacitor.

In summary, according to a gate driving circuit applied to a motor inverter and a gate driving method of any embodiment of the present invention, a switch circuit can be driven by using one independent power supply.

DETAILED DESCRIPTION

A gate driving circuit according to any embodiment herein can be applied to a motor inverter, and is adapted to control the switching of an insulated switch, thereby supplying power for the motor inverter. A three-phase three-wire motor inverter is taken as an example in the following.

It should be clear that the enabling of a switch mentioned below means that the switch is repeatedly turned on and off during an action; and the disabling of the switch mentioned below means that the switch remains inactive during the action, that is, remain off-state.

Figure 1:
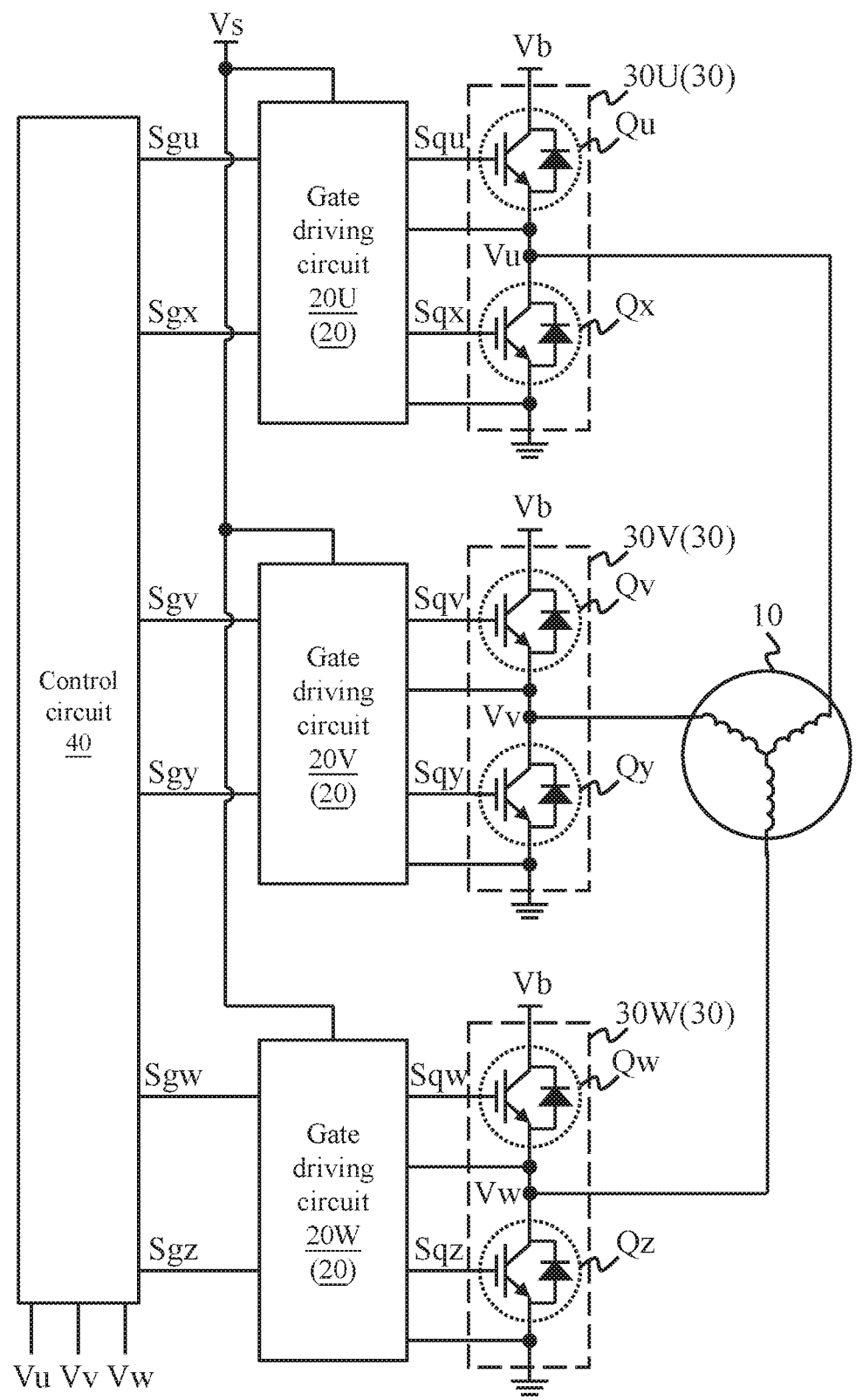
FIG. 1 is a schematic diagram of a gate driving circuit according to an embodiment.

In an embodiment, referring to FIG. 1, three gate driving circuits 20U, 20V, and 20W control a switching of three switch circuits 30U, 30V, and 30W to provide three phase supply voltages Vu, Vv, and Vw to a motor inverter 10. A control end of the gate driving circuits 20 is coupled to a control circuit 40. The control circuit 40 monitors the supply voltages Vu, Vv, and Vw and accordingly provides pulse width modulation (PWM) signals Sgu, Sgx, Sgv, Sgy, Sgw, and Sgz to the gate driving circuits 20U, 20V, and 20W. Each gate driving circuit 20 has substantially the same circuit architecture and operation, and each switch circuit 30 has substantially the same circuit architecture and operation as well. In some embodiments, each gate driving circuit 20 may include an upper arm driving circuit and a lower arm driving circuit having substantially the same circuit architecture, and each switch circuit 30 includes an upper arm insulated switch and a lower arm insulated switch connected in series between a bus power supply Vb and ground. Each switch circuit 30 outputs corresponding supply voltage Vu/Vv/Vw from a connection point between the upper arm insulated switch and the lower arm insulated switch. The gate driving circuits 20U, 20V, and 20W correspond respectively to the switch circuits 30U, 30V, and 30W. Each gate driving circuit 20 is coupled to an independent power supply Vs, and to a control end of the upper arm insulated switch and a control end of the lower arm insulated switch of the corresponding switch circuit 30. Each gate driving circuit 20 generates control signals Squ, Sqx/Sqv, Sqy/Sqw, Sqz according to the independent power supply Vs and the corresponding PWM signals Sgu, Sgx/Sgv, Sgy/Sgw, Sgz, to control the switching between the upper arm insulated switch and the lower arm insulated switch of the corresponding switch circuit 30.

In an embodiment, referring to FIG. 1 and FIG. 2, a first-phase (that is, U-phase) gate driving circuit 20U is adapted to control a switching of the upper arm insulated switch (hereinafter referred to as a first insulated switch Qu) and the lower arm insulated switch (hereinafter referred to as a second insulated switch Qx) of the switch circuit 30U. A first end of the first insulated switch Qu is electrically connected to the bus power supply Vb. A second end of the first insulated switch Qu is electrically connected to a first end of the second insulated switch Qx. A second end of the second insulated switch Qx is electrically connected to ground. In addition, the second end of the first insulated switch Qu and the first end of the second insulated switch Qx are commonly electrically connected to the motor inverter 10.

The gate driving circuit 20U includes a first power switch circuit G1, an upper arm driving circuit and a lower arm driving circuit. The first power switch circuit G1 includes an upper arm power switch circuit (hereinafter referred to as a first isolation gate circuit GU) for controlling a power supply (that is, an independent power supply Vs) of the upper arm driving circuit, and a lower arm power switch circuit (hereinafter referred to as a second isolation gate circuit GX) for controlling a power supply (that is, the independent power supply Vs) of the lower arm driving circuit.

The upper arm driving circuit of the gate driving circuit 20U includes an upper arm bootstrap fast charging circuit (hereinafter referred to as a first bootstrap fast charging circuit CCU), an upper arm pre-charging capacitor (hereinafter referred to as a first capacitor Cpu) and an upper arm bootstrap capacitor (hereinafter referred to as a second capacitor Cbu). The first isolation gate circuit GU includes an upper arm power switch (hereinafter referred to as a first power switch). A first end of the first capacitor Cpu is electrically connected to the independent power supply Vs and a first end of the first power switch, and a second end of the first capacitor Cpu is electrically connected to the second end of the first insulated switch Qu and the first end of the second insulated switch Qx. The first bootstrap fast charging circuit CCU and a first end of the second capacitor Cbu are electrically connected to a second end of the first power switch. A second end of the second capacitor Cbu is electrically connected to the first bootstrap fast charging circuit CCU, and is electrically connected via a resistor Rgu to a control end of the first insulated switch Qu. A control end of the first power switch receives the PWM signal Sgu.

The lower arm driving circuit of the gate driving circuit 20U includes a lower arm bootstrap fast charging circuit (hereinafter referred to as a second bootstrap fast charging circuit CCX) and a lower arm bootstrap capacitor (hereinafter referred to as a third capacitor Cbx). The second isolation gate circuit GX includes a lower arm power switch (hereinafter referred to as a second power switch). A first end of the second power switch is electrically connected to the independent power supply Vs, and a second end of the second power switch is electrically connected to the second bootstrap fast charging circuit CCX and a first end of the third capacitor Cbx. A second end of the third capacitor Cbx is electrically connected to the second bootstrap fast charging circuit CCX, and is electrically connected via a resistor Rgx to a control end of the second insulated switch Qx. A control end of the second power switch receives the PWM signal Sgx.

Figure 2:
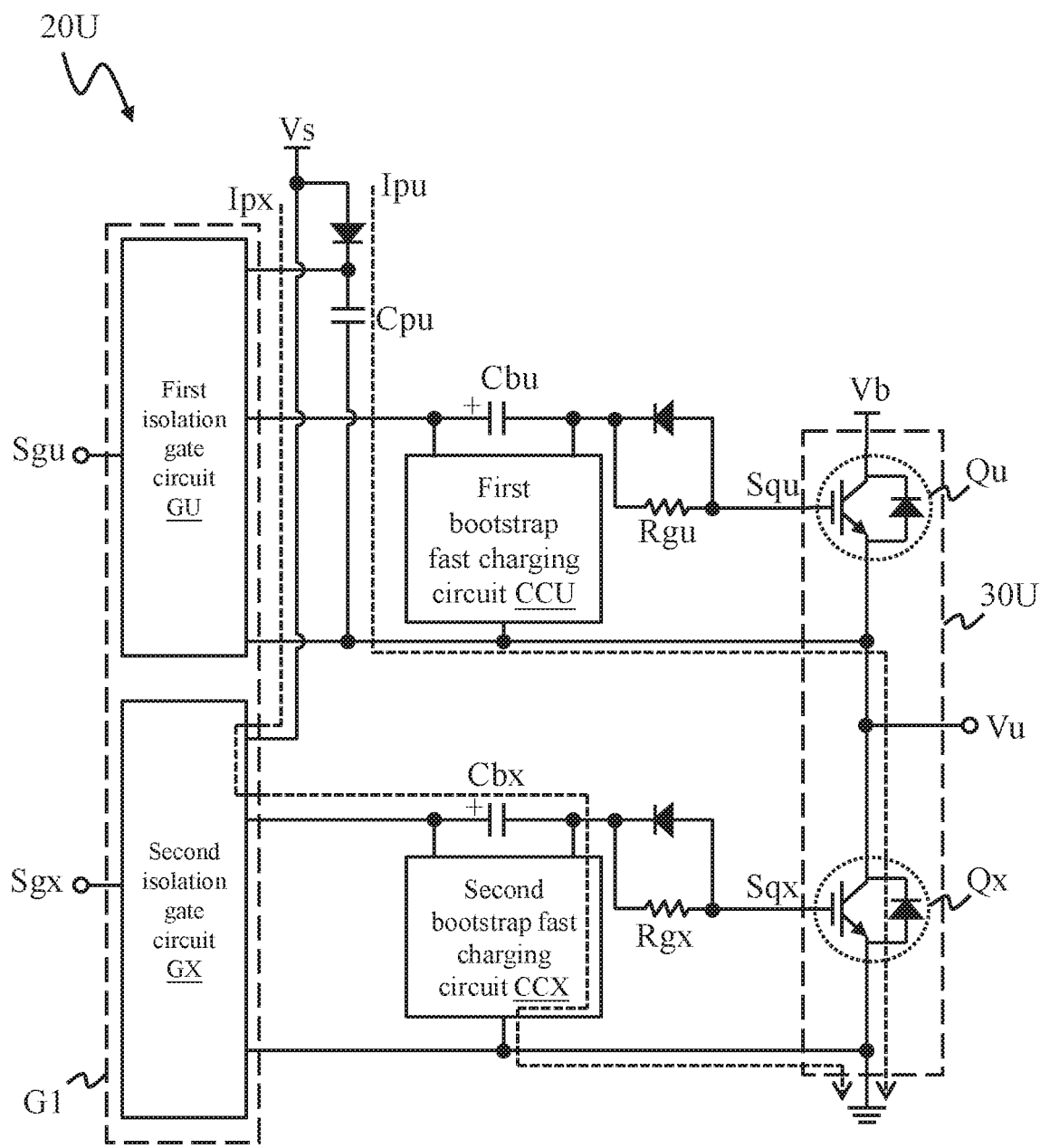
FIG. 2 is a schematic diagram of an example of the gate driving circuit of a first phase shown in FIG. 1 in a first charging phase.
Figure 8:
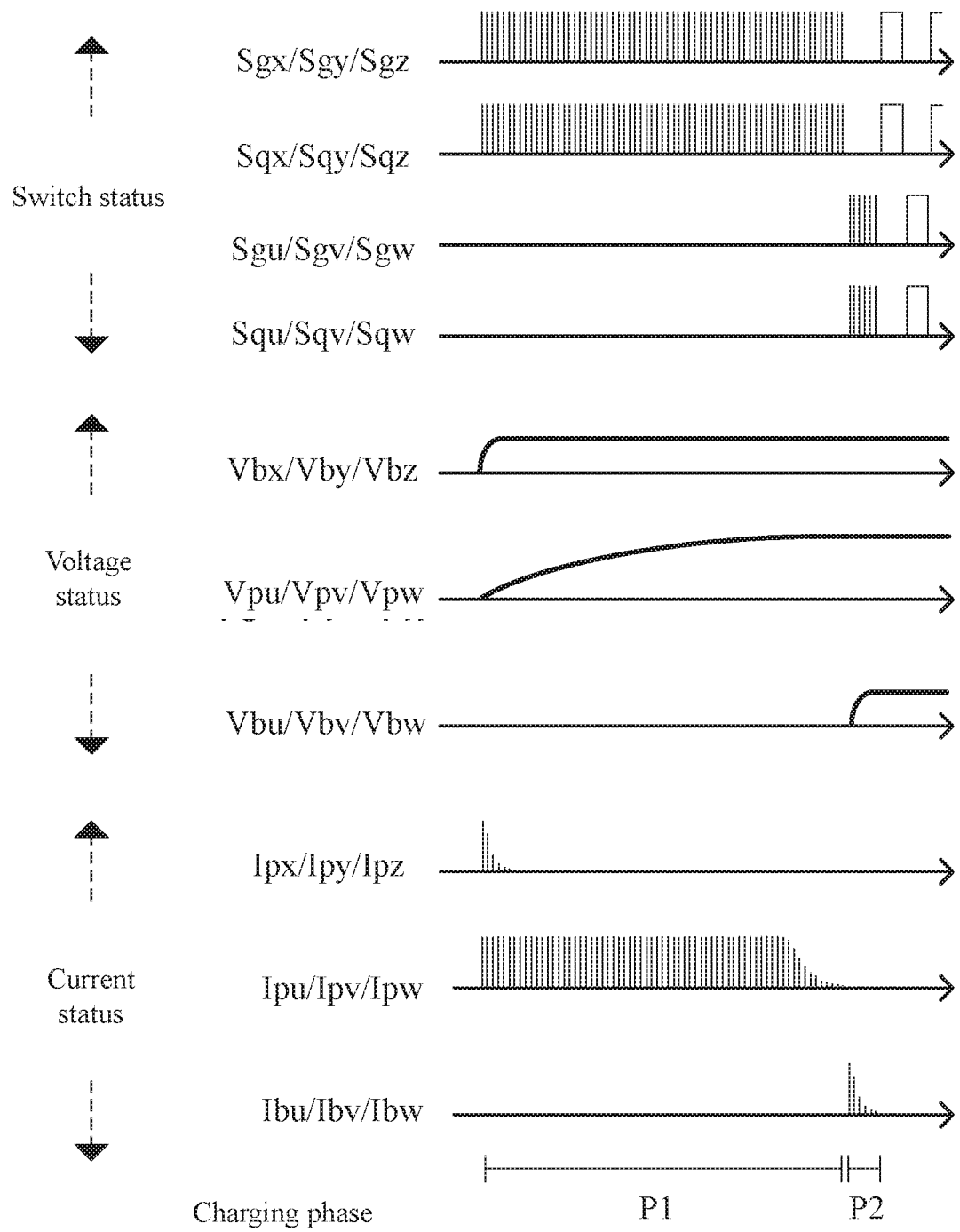
FIG. 8 is a sequence diagram of each signal in FIG. 2 to FIG. 7.

Referring to FIG. 2 and FIG. 8, during a first charging phase P1, the first isolation gate circuit GU disables the first power switch in response to the PWM signal Sgu, and the second isolation gate circuit GX enables the second power switch in response to the PWM signal Sgx. When the first power switch is disabled and the second power switch is enabled, the independent power supply Vs enables the second bootstrap fast charging circuit CCX to charge the third capacitor Cbx, that is, a charging current Ipx charges the third capacitor Cbx to enable the second insulated switch Qx. During the enabling of the second insulated switch Qx, when the second insulated switch Qx is turned on, the independent power supply Vs charges the first capacitor Cpu, that is, the charging current Ipu charges the first capacitor Cpu. A control signal Sqx received by the control end of the second insulated switch Qx is shown in FIG. 8.

Figure 3:
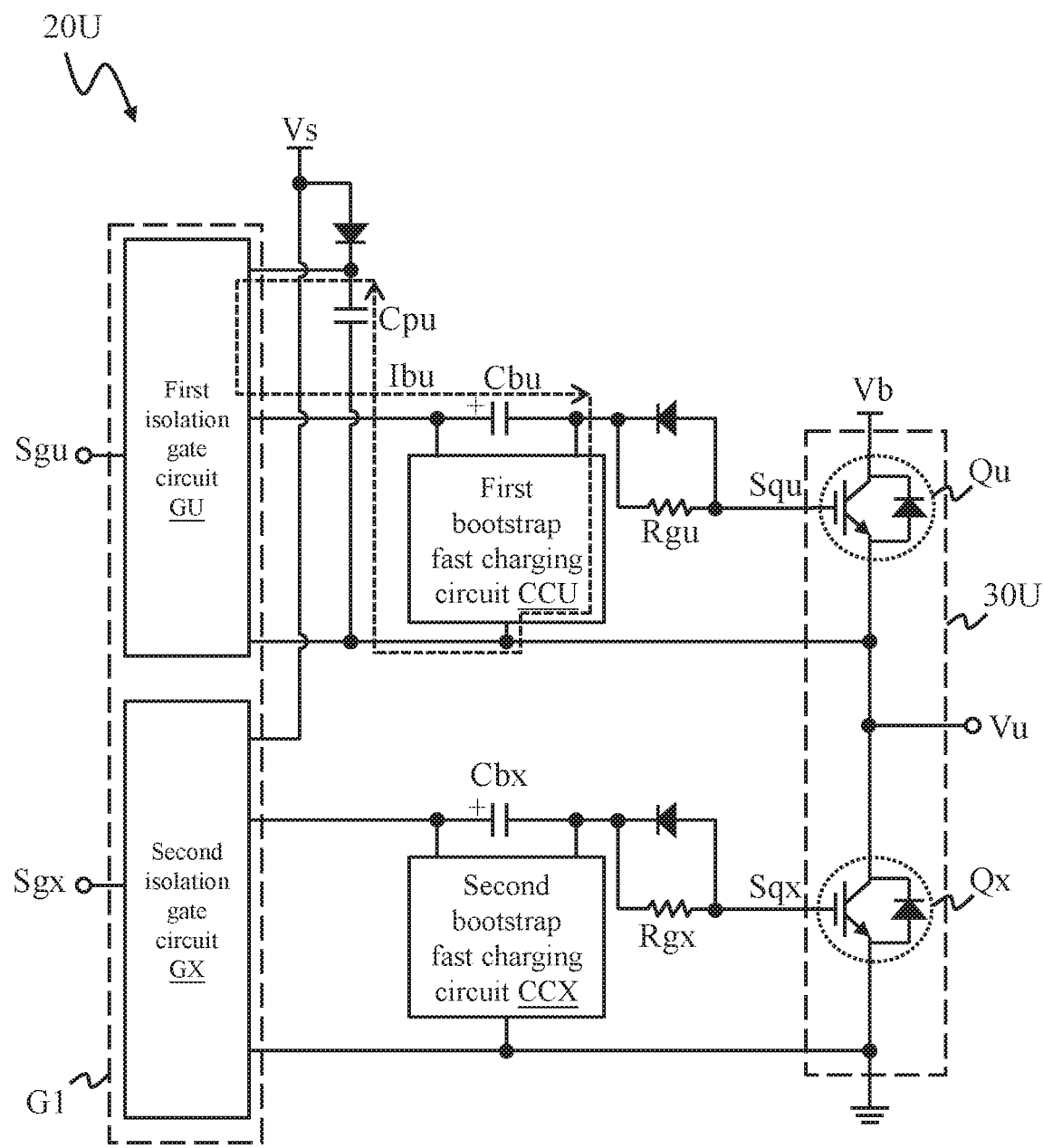
FIG. 3 is a schematic diagram of an example of the gate driving circuit of a first phase shown in FIG. 1 in a second charging phase.

Next, referring to FIG. 3 and FIG. 8, during a second charging phase P2, the first isolation gate circuit GU enables the first power switch in response to the PWM signal Sgu, and the second isolation gate circuit GX disables the second power switch in response to the PWM signal Sgx. When the first power switch is enabled and the second power switch is disabled, the independent power supply Vs enables, via the first capacitor Cpu, the first bootstrap fast charging circuit CCU to charge the second capacitor Cbu, that is, the charging current Ibu charges the second capacitor Cbu to enable the first insulated switch Qu. A control signal Squ received by the control end of the first insulated switch Qu is shown in FIG. 8.

Herein, during the first charging phase P1 and the second charging phase P2, the variations in the potential Vpu of the first capacitor Cpu, the potential Vbu of the second capacitor Cbu, and the potential Vbx of the third capacitor Cbx are shown in FIG. 8.

Figure 4:
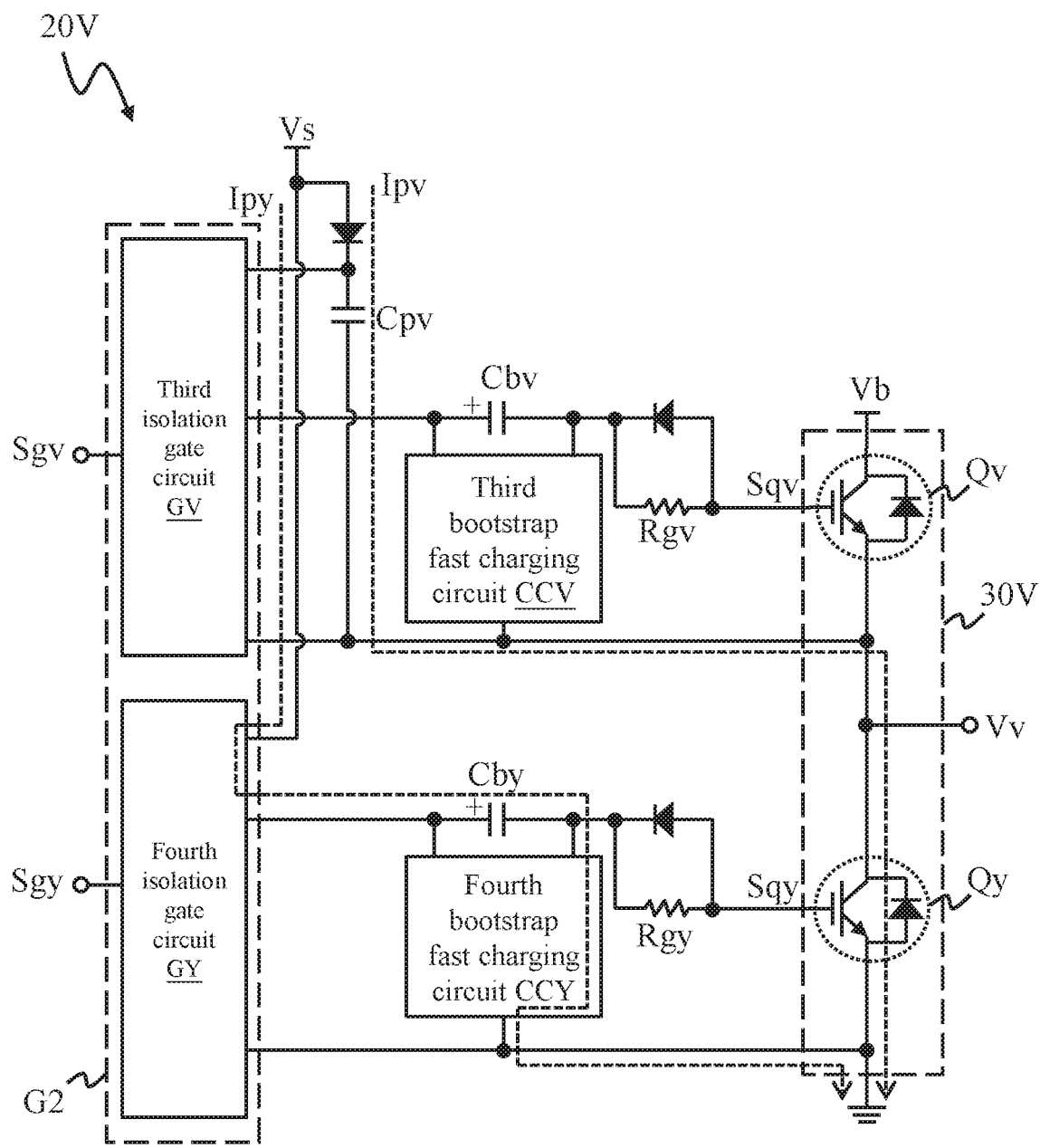
FIG. 4 is a schematic diagram of an example of the gate driving circuit of a second phase shown in FIG. 1 in a first charging phase.

Referring to FIG. 1 and FIG. 4, the second-phase (that is, V-phase) gate driving circuit 20V is adapted to control a switching of the upper arm insulated switch (hereinafter referred to as a third insulated switch Qv) and the lower arm insulated switch (hereinafter referred to as a fourth insulated switch Qy) of the switch circuit 30V. A first end of the third insulated switch Qv is electrically connected to the bus power supply Vb. A second end of the third insulated switch Qv is electrically connected to a first end of the fourth insulated switch Qy. A second end of the fourth insulated switch Qy is electrically connected to ground. In addition, the second end of the third insulated switch Qv and the first end of the fourth insulated switch Qy are commonly electrically connected to the motor inverter 10.

The gate driving circuit 20V includes a second power switch circuit G2, an upper arm driving circuit and a lower arm driving circuit. The second power switch circuit G2 includes an upper arm power switch circuit (hereinafter referred to as a third isolation gate circuit GV) for controlling the power supply (that is, the independent power supply Vs) of the upper arm driving circuit and a lower arm power switch circuit (hereinafter referred to as a fourth isolation gate circuit GX) for controlling the power supply (that is, the independent power supply Vs) of the lower arm driving circuit.

The upper arm driving circuit of the gate driving circuit 20V includes an upper arm bootstrap fast charging circuit (hereinafter referred to as a third bootstrap fast charging circuit CCV), an upper arm pre-charging capacitor (hereinafter referred to as a fourth capacitor Cpv) and an upper arm bootstrap capacitor (hereinafter referred to as a fifth capacitor Cbv). The third isolation gate circuit GV includes an upper arm power switch (hereinafter referred to as a third power switch). A first end of the fourth capacitor Cpv is electrically connected to the independent power supply Vs and a first end of the third power switch, and a second end of the fourth capacitor Cpv is electrically connected to the second end of the third insulated switch Qv and the first end of the fourth insulated switch Qy. The third bootstrap fast charging circuit CCV and a first end of the fifth capacitor Cbv are electrically connected to a second end of the third power switch. A second end of the fifth capacitor Cbv is electrically connected to the third bootstrap fast charging circuit CCV, and is electrically connected via a resistor Rgv to a control end of the third insulated switch Qv. A control end of the third power switch receives the PWM signal Sgv.

The lower arm driving circuit of the gate driving circuit 20V includes a lower arm bootstrap fast charging circuit (hereinafter referred to as a second bootstrap fast charging circuit CCY) and a lower arm bootstrap capacitor (hereinafter referred to as a sixth capacitor Cby). The fourth isolation gate circuit GY includes a lower arm power switch (hereinafter referred to as a fourth power switch). A first end of the fourth power switch is electrically connected to the independent power supply Vs, and a second end of the fourth power switch is electrically connected to the fourth bootstrap fast charging circuit CCY and a first end of the sixth capacitor Cby. A second end of the sixth capacitor Cby is electrically connected to the fourth bootstrap fast charging circuit CCY, and is electrically connected via a resistor Rgy to a control end of the fourth insulated switch Qy. A control end of the fourth power switch receives the PWM signal Sgy.

Referring to FIG. 4 and FIG. 8, during the first charging phase P1, the third isolation gate circuit GV disables the third power switch in response to the PWM signal Sgv, and the fourth isolation gate circuit GY enables the fourth power switch in response to the PWM signal Sgy. When the third power switch is disabled and the fourth power switch is enabled, the independent power supply Vs enables the fourth bootstrap fast charging circuit CCY to charge the sixth capacitor Cby, that is, a charging current Ipy charges the sixth capacitor Cby, to enable the fourth insulated switch Qy. During the enabling of the fourth insulated switch Qy, when the fourth insulated switch Qy is turned on, the independent power supply Vs charges the fourth capacitor Cpv, that is, a charging current Ipv charges the fourth capacitor Cpv. A control signal Sqy received by the control end of the fourth insulated switch Qy is shown in FIG. 8.

Figure 5:
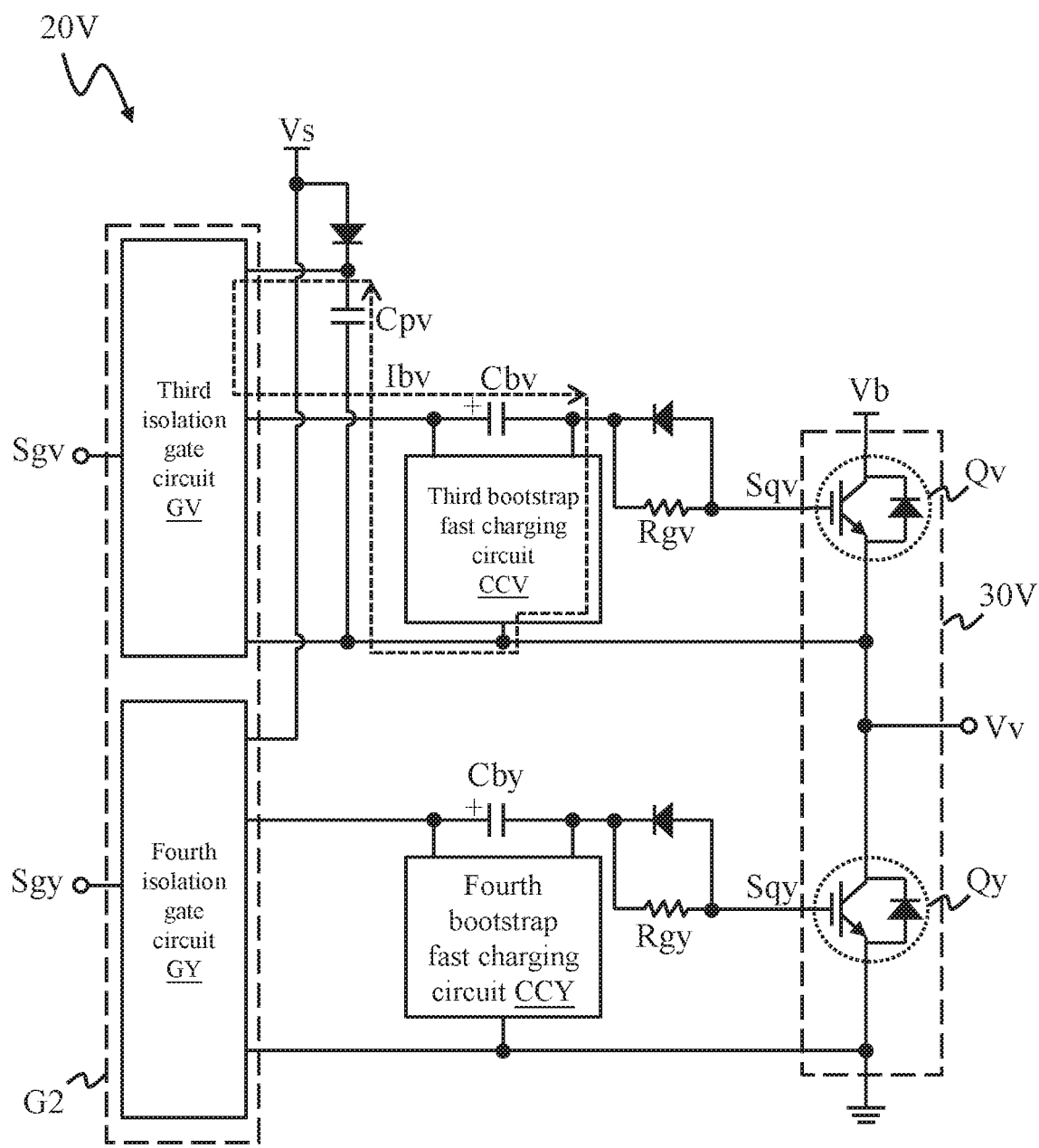
FIG. 5 is a schematic diagram of an example of the gate driving circuit of a second phase shown in FIG. 1 in a second charging phase.

Next, referring to FIG. 5 and FIG. 8, during the second charging phase P2, the third isolation gate circuit GV enables the third power switch in response to the PWM signal Sgv, and the fourth isolation gate circuit GY disables the fourth power switch in response to the PWM signal Sgy. When the third power switch is enabled and the fourth power switch is disabled, the independent power supply Vs enables, via the fourth capacitor Cpv, the third bootstrap fast charging circuit CCV to charge the fifth capacitor Cbv, that is, a charging current Ibv charges the fifth capacitor Cbv to enable the third insulated switch Qv. A control signal Sqv received by the control end of the third insulated switch Qv is shown in FIG. 8.

Herein, during the first charging phase P1 and the second charging phase P2, variations in the potential Vpv of the fourth capacitor Cpv, the potential Vbv of the fifth capacitor Cbv, and the potential Vby of the sixth capacitor Cby are shown in FIG. 8.

Figure 6:
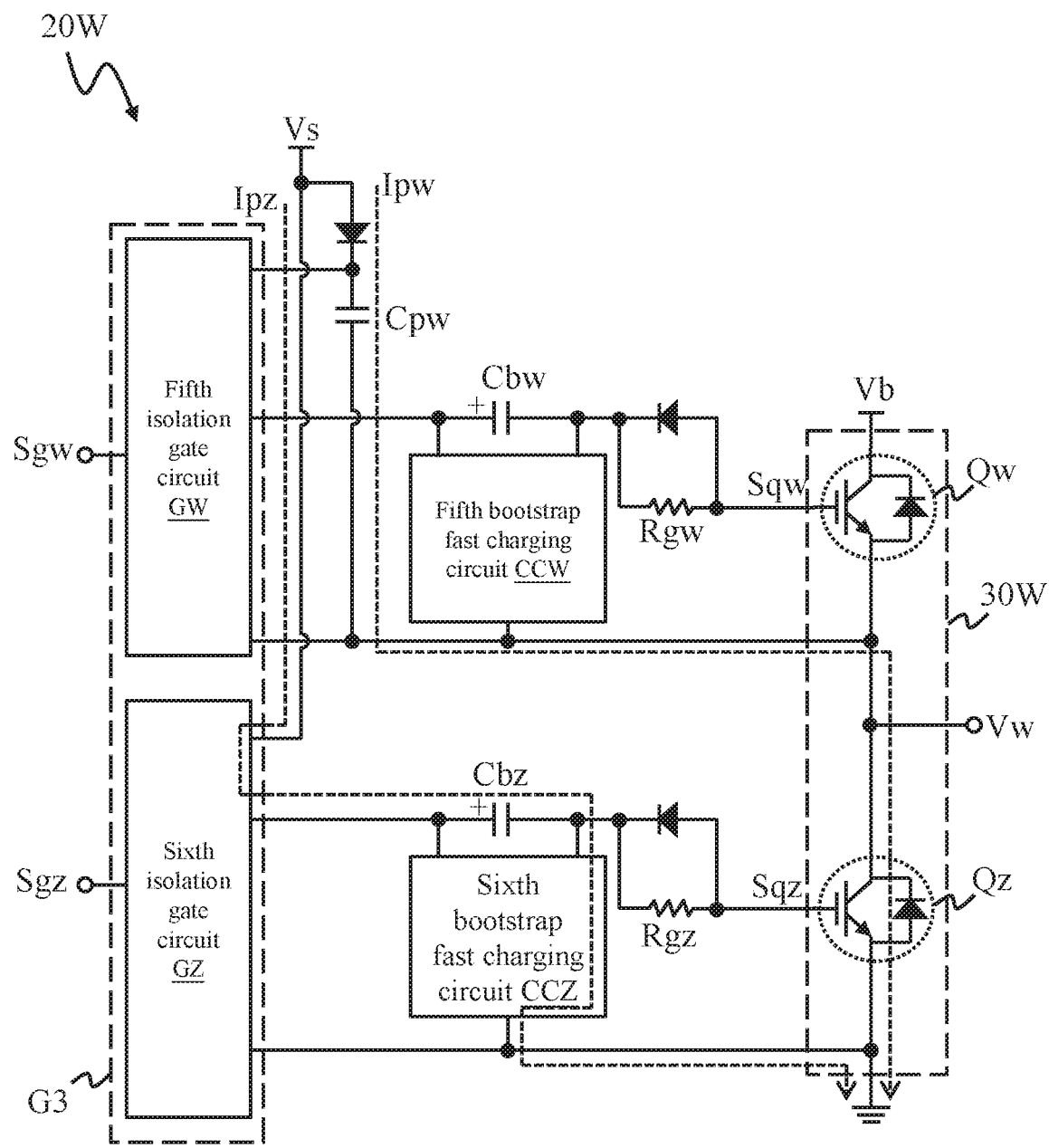
FIG. 6 is a schematic diagram of an example of the gate driving circuit of a third phase shown in FIG. 1 in a first charging phase.

Referring to FIG. 1 and FIG. 6, the third-phase (that is, W-phase) gate driving circuit 20W is adapted to control a switching of the upper arm insulated switch (hereinafter referred to as a fifth insulated switch Qw) and the lower arm insulated switch (hereinafter referred to as a sixth insulated switch Qz) of the switch circuit 30W. A first end of the fifth insulated switch Qw is electrically connected to the bus power supply Vb. A second end of the fifth insulated switch Qw is electrically connected to a first end of the sixth insulated switch Qz. A second end of the sixth insulated switch Qz is electrically connected to ground. In addition, the second end of the fifth insulated switch Qw and the first end of the sixth insulated switch Qz are commonly electrically connected to the motor inverter 10.

The gate driving circuit 20W includes a third power switch circuit G3, an upper arm driving circuit and a lower arm driving circuit. The third power switch circuit G3 includes an upper arm power switch circuit (hereinafter referred to as a fifth isolation gate circuit GW) for controlling the power supply (that is, the independent power supply Vs) of the upper arm driving circuit and a lower arm power switch circuit (hereinafter referred to as a sixth isolation gate circuit GZ) for controlling the power supply (that is, the independent power supply Vs) of the lower arm driving circuit.

The upper arm driving circuit of the gate driving circuit 20W includes an upper arm bootstrap fast charging circuit (hereinafter referred to as a fifth bootstrap fast charging circuit CCW), an upper arm pre-charging capacitor (hereinafter referred to as a seventh capacitor Cpw) and an upper arm bootstrap capacitor (hereinafter referred to as an eighth capacitor Cbw). The fifth isolation gate circuit GW includes an upper arm power switch (hereinafter referred to as a fifth power switch). A first end of the seventh capacitor Cpw is electrically connected to the independent power supply Vs and a first end of the fifth power switch, and a second end of the seventh capacitor Cpw is electrically connected to the second end of the fifth insulated switch Qw and the first end of the sixth insulated switch Qz. The fifth bootstrap fast charging circuit CCW and a first end of the eighth capacitor Cbw are electrically connected to a second end of the fifth power switch. A second end of the eighth capacitor Cbw is electrically connected to the fifth bootstrap fast charging circuit CCW, and is electrically connected via a resistor Rgw to a control end of the fifth insulated switch Qw. A control end of the third power switch receives the PWM signal Sgw.

The lower arm driving circuit of the gate driving circuit 20W includes a lower arm bootstrap fast charging circuit (hereinafter referred to as a sixth bootstrap fast charging circuit CCZ) and a lower arm bootstrap capacitor (hereinafter referred to as a ninth capacitor Cbz). The sixth isolation gate circuit GZ includes a lower arm power switch (hereinafter referred to as a sixth power switch). A first end of the sixth power switch is electrically connected to the independent power supply Vs, and a second end of the sixth power switch is electrically connected to the sixth bootstrap fast charging circuit CCZ and a first end of the ninth capacitor Cbz. A second end of the ninth capacitor Cbz is electrically connected to the sixth bootstrap fast charging circuit CCZ, and is electrically connected via a resistor Rgz to a control end of the sixth insulated switch Qz. A control end of the sixth power switch receives the PWM signal Sgz.

Referring to FIG. 6 and FIG. 8, during the first charging phase P1, the fifth isolation gate circuit GW disables the fifth power switch in response to the PWM signal Sgw, and the sixth isolation gate circuit GZ enables the sixth power switch in response to the PWM signal Sgz. When the fifth power switch is disabled and the sixth power switch is enabled, the independent power supply Vs enables the sixth bootstrap fast charging circuit CCZ to charge the ninth capacitor Cbz, that is, a charging current Ipz charges the ninth capacitor Cbz to enable the sixth insulated switch Qz. During the enabling of the sixth insulated switch Qz, when the sixth insulated switch Qz is turned on, the independent power supply Vs charges the seventh capacitor Cpw, that is, a charging current Ipw charges seventh capacitor Cpw. A control signal Sqz received by the control end of the sixth insulated switch Qz is shown in FIG. 8.

Figure 7:
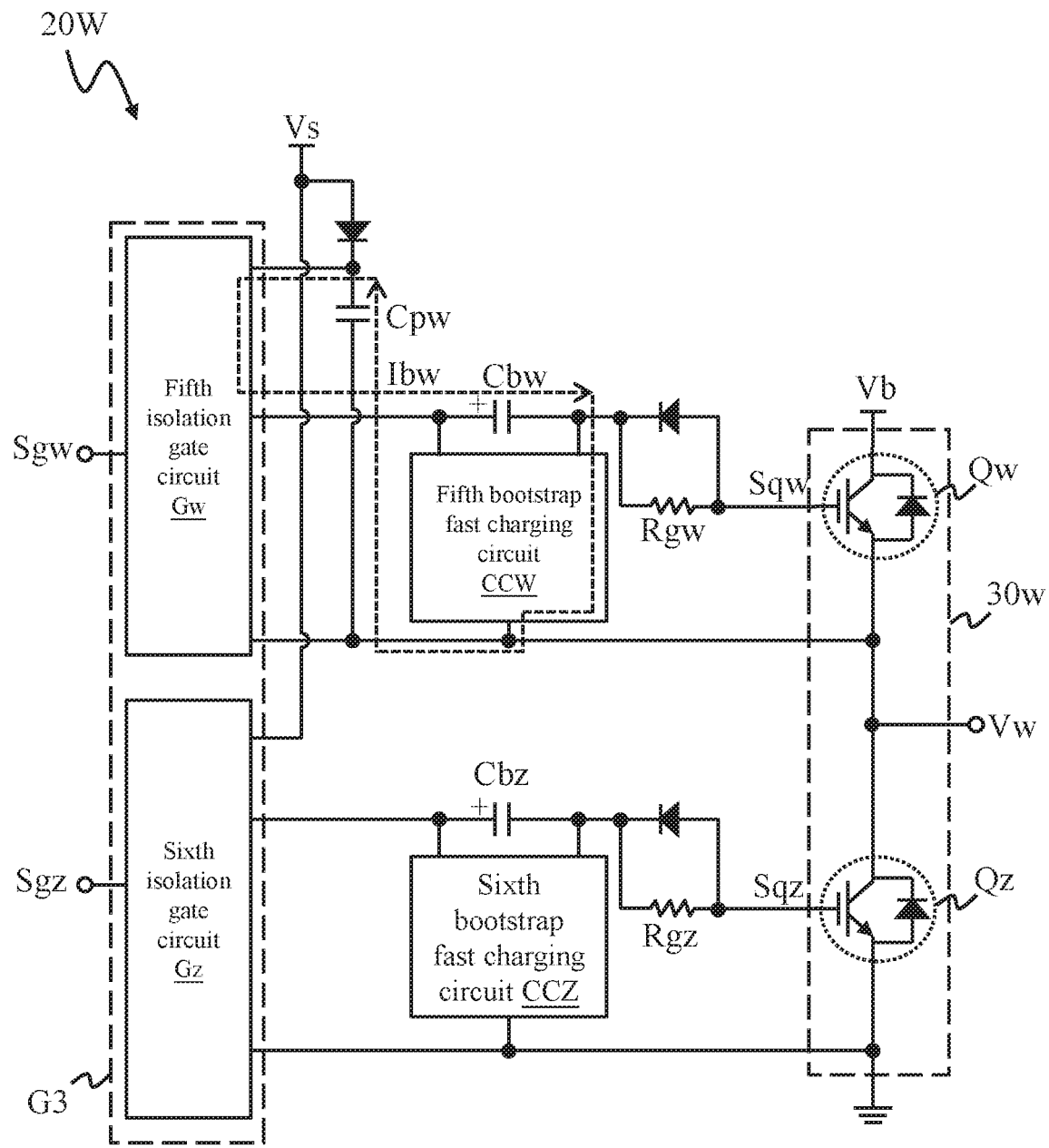
FIG. 7 is a schematic diagram of an example of the gate driving circuit of a third phase shown in FIG. 1 in a second charging phase.

Next, referring to FIG. 7 and FIG. 8, during the second charging phase P2, the fifth isolation gate circuit GW enables the fifth power switch in response to the PWM signal Sgw, and the sixth isolation gate circuit GZ disables the sixth power switch in response to the PWM signal Sgz. When the fifth power switch is enabled and the sixth power switch is disabled, the independent power supply Vs enables, via the seventh capacitor Cpw, the fifth bootstrap fast charging circuit CCW to charge the eighth capacitor Cbw, that is, a charging current Ibw charges the eighth capacitor Cbw to enable the fifth insulated switch Qw. A control signal Sqz received by the control end of the fifth insulated switch Qw is shown in FIG. 8.

Herein, during the first charging phase P1 and the second charging phase P2, variations in the potential Vpw of seventh capacitor Cpw, the potential Vbw of the eighth capacitor Cbw, and the potential Vbz of the ninth capacitor Cbz are shown in FIG. 8.

In some embodiments, the upper arm bootstrap fast charging circuit may include a charging switch. A control end of the charging switch is coupled to a first end of the upper arm bootstrap capacitor, a first end of the charging switch is coupled to a second end of the upper arm bootstrap capacitor, and a second end of the charging switch is coupled to a second end of the upper arm insulated switch. The upper arm power switch circuit may include two upper arm power switches serially connected between the independent power supply Vs and the second end of the upper arm insulated switch. The lower arm bootstrap fast charging circuit may include a charging switch. A control end of the charging switch is coupled to a first end of the lower arm bootstrap capacitor, a first end of the charging switch is coupled to a second end of the lower arm bootstrap capacitor, and a second end of the charging switch is coupled to ground. The upper arm power switch circuit may include two lower arm power switches serially connected between the independent power supply Vs and ground.

Figure 9:
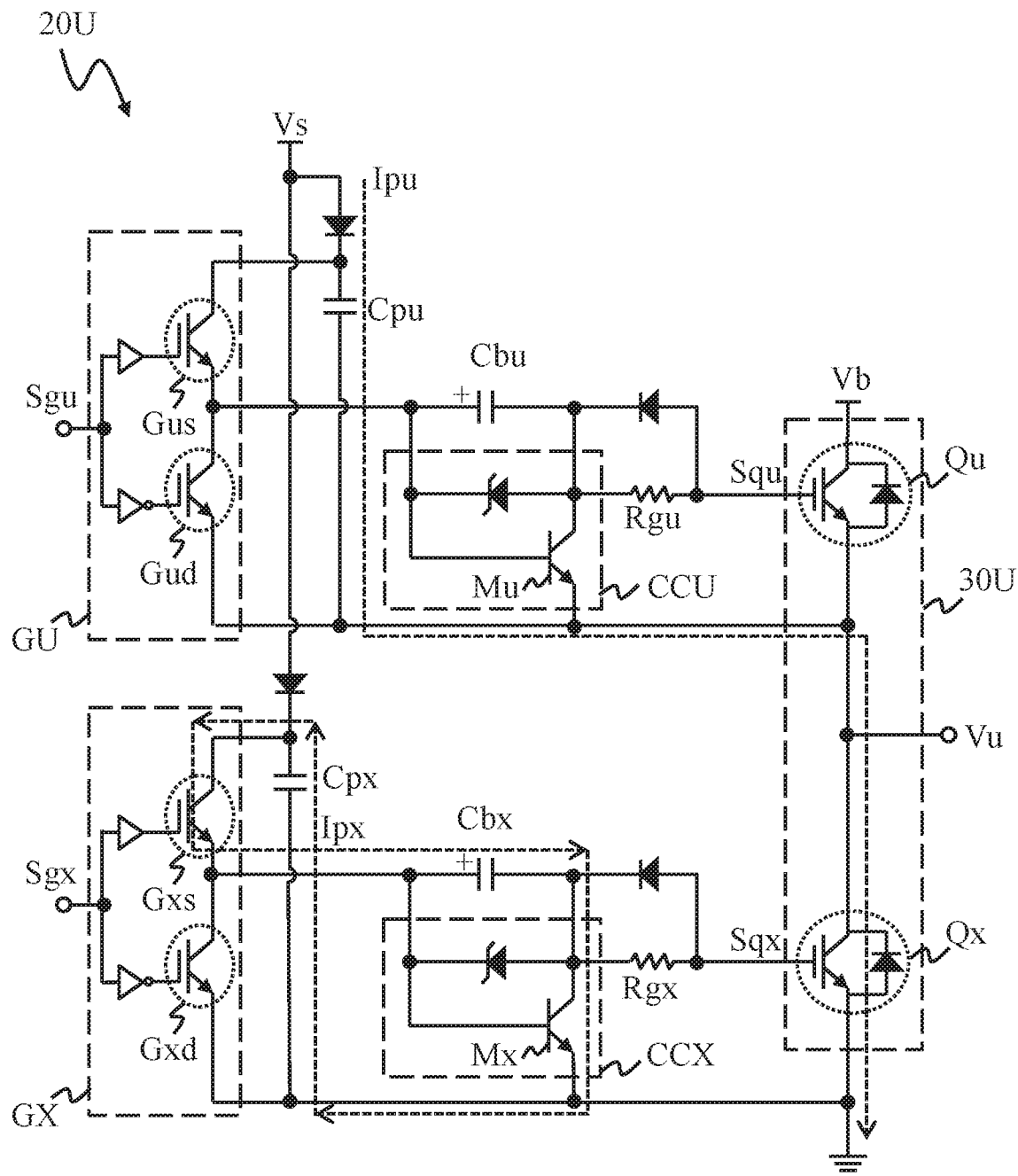
FIG. 9 is a schematic diagram of another example of the gate driving circuit of a first phase shown in FIG. 1 in a first charging phase.

In an example, referring to FIG. 9, the first bootstrap fast charging circuit CCU includes a charging switch Mu. In addition to the foregoing first power switch Gus, the first isolation gate circuit GU further includes an additional upper arm power switch (hereinafter referred to as a seventh power switch Gud). Here, the first power switch Gus and the seventh power switch Gud operate in a complementary mode. The first end of the first power switch Gus is electrically connected to the independent power supply Vs, the second end of the first power switch Gus is electrically connected to a first end of the seventh power switch Gud, and a second end of the seventh power switch Gud is electrically connected to the second end of the first insulated switch Qu and the first end of the second insulated switch Qx. A control end of the charging switch Mu is electrically connected, via the first power switch Gus, to the independent power supply Vs, that is, electrically connected to the second end of the first power switch Gus and the second end of the seventh power switch Gud. A first end of the charging switch Mu is electrically connected to the second end of the second capacitor Cbu, and a second end of the charging switch Mu is electrically connected to the second end of the first insulated switch Qu and the first end of the second insulated switch Qx. The first end of the second capacitor Cbu is also electrically connected to the second end of the first power switch Gus and the second end of the seventh power switch Gud.

The second bootstrap fast charging circuit CCX includes a charging switch Mx. In addition to the foregoing second power switch Gxs, the second isolation gate circuit GX further includes an additional upper arm power switch (hereinafter referred to as an eighth power switch Gxd). Herein, the second power switch Gxs and the eighth power switch Gxd operate in complementary modes. The first end of the second power switch Gxs is electrically connected to the independent power supply Vs, the second end of the second power switch Gxs is electrically connected to a first end of the eighth power switch Gxd, and a second end of the eighth power switch Gxd is electrically connected to the second end of the second insulated switch Qx and ground. A control end of the charging switch Mx is electrically connected, via the second power switch Gxs, to the independent power supply Vs, that is, electrically connected to the second end of the second power switch Gxs and the second end of the eighth power switch Gxd. A first end of the charging switch Mu is electrically connected to the second end of the third capacitor Cbx, and a second end of the charging switch Mx is electrically connected to the second end of the second insulated switch Qx and ground. The first end of the third capacitor Cbx is also electrically connected to the second end of the second power switch Gxs and the second end of the seventh power switch Gud.

Figure 18:
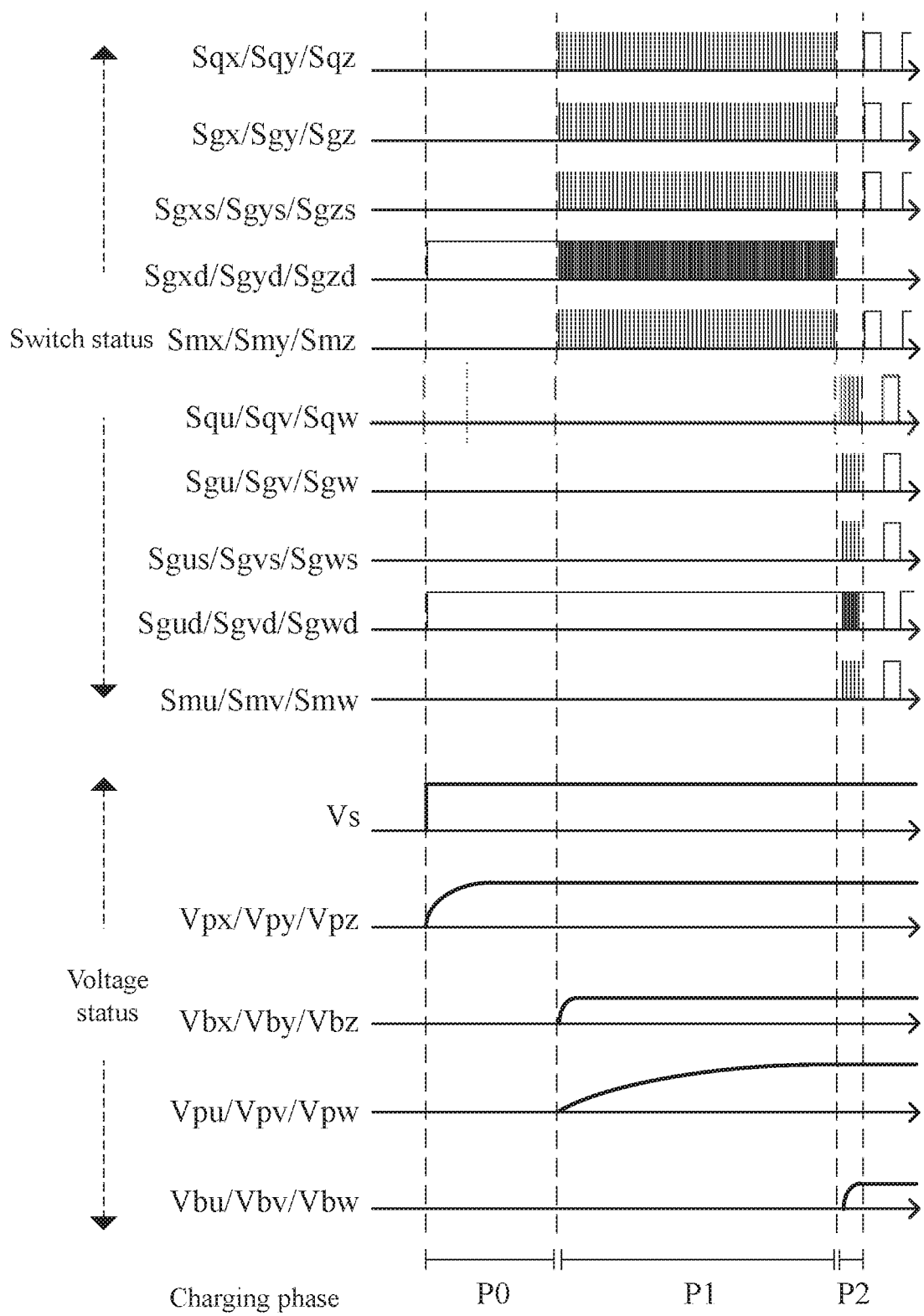
FIG. 18 is a sequence diagram of each signal in FIG. 9 to FIG. 17.

During action, the first power switch Gus is controlled by the PWM signal Sgu, and the seventh power switch Gud is controlled by the inverted PWM signal Sgu. The second power switch Gxs is controlled by the PWM signal Sgx, and the eighth power switch Gxd is controlled by the inverted PWM signal Sgx. In an example, the control end of the first power switch Gus receives a PWM signal Sgu delayed by a buffer gate, that is, the PWM signal Sgus as shown in FIG. 18. A control end of the seventh power switch Gud receives a PWM signal Sgu inverted by an inverter, that is, the PWM signal Sgud as shown in FIG. 18. The control end of the second power switch Gxs receives a PWM signal Sgx delayed by a buffer gate, that is, the PWM signal Sgxs as shown in FIG. 18. A control end of the eighth power switch Gxd receives a PWM signal Sgx inverted by an inverter, that is, the PWM signal Sgxd as shown in FIG. 18.

Figure 10:
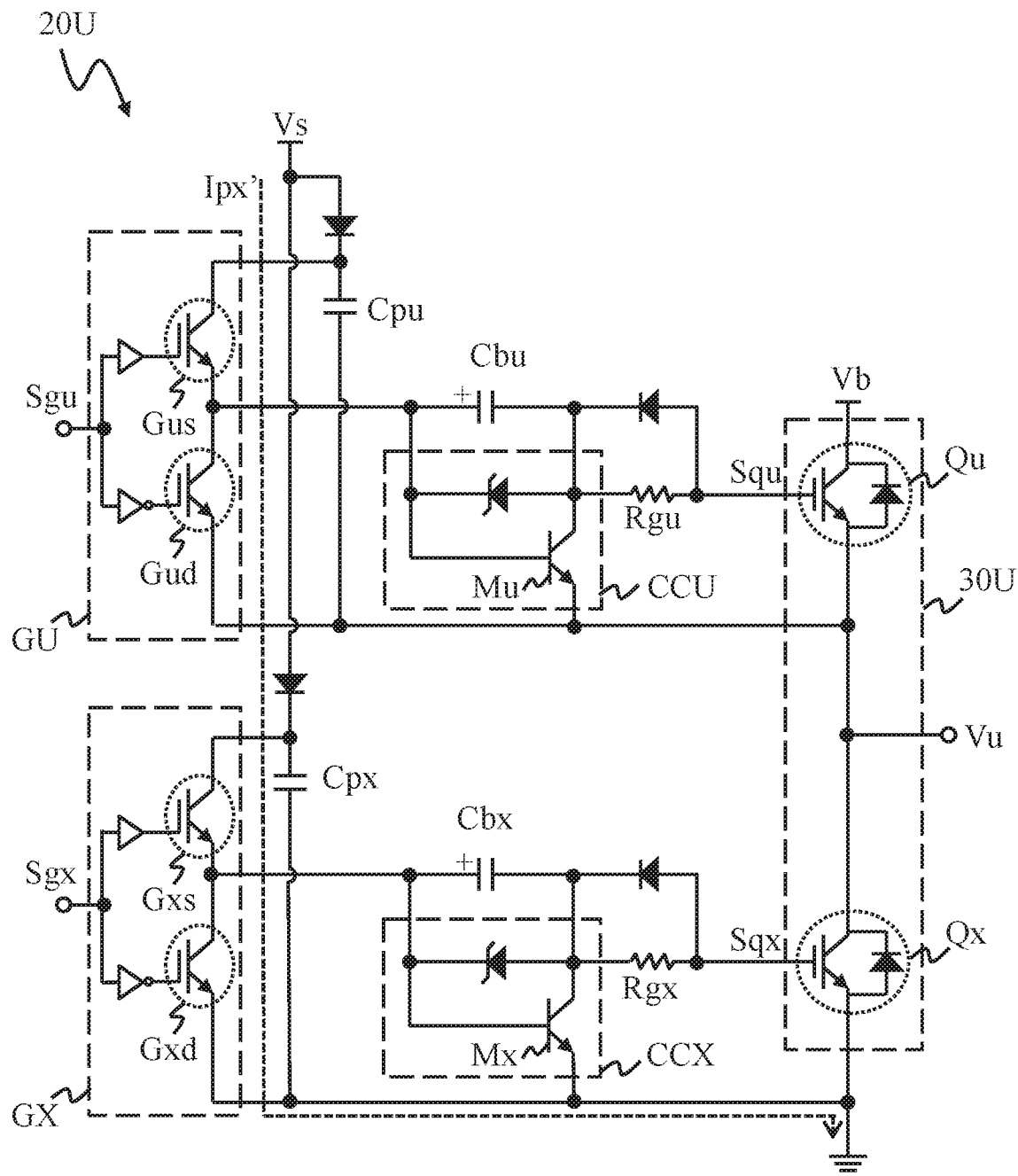
FIG. 10 is a schematic diagram of another example of the gate driving circuit of a first phase shown in FIG. 1 in a pre-charging phase.

Referring to FIG. 9 and FIG. 18, during a first charging phase P1, the second power switch Gxs and the eighth power switch Gxd are enabled synchronously and operate in complementary modes according to the PWM signal Sgx, that is, enabled respectively in response to the PWM signal Sgxs and the PWM signal Sgxd. The first power switch Gus and the seventh power switch Gud are disabled according to the PWM signal Sgu. When the second power switch Gxs is turned on and the eighth power switch Gxd is turned off, the charging switch Mx is turned on under a control of the independent power supply Vs (for example, a control signal Smx as shown in FIG. 18), so that the independent power supply Vs charges the third capacitor Cbx, that is, the charging current Ipx charges the third capacitor Cbx, thereby enabling the second insulated switch Qx. In some embodiments, the lower arm driving circuit may further include a lower arm pre-charging capacitor (hereinafter referred to as a tenth capacitor Cpx), and the tenth capacitor Cpx is electrically connected between the independent power supply Vs and ground, that is, connected in parallel with the second isolation gate circuit GX. Before the first charging phase P1, that is, during a pre-charging phase P0, the independent power supply Vs precharges the tenth capacitor Cpx, that is, a charging current Ipx' charges the tenth capacitor Cpx, as shown in FIG. 10. Subsequently, during the first charging phase P1, when the second power switch Gxs is turned on and the eighth power switch Gxd is turned off, the charging switch Mx is turned on under the control of the independent power supply Vs. At this point, the tenth capacitor Cpx, the second power switch Gxs, the third capacitor Cbx and the charging switch Mx form a charging loop (hereinafter referred to as a first charging path). In the first charging path, the tenth capacitor Cpx releases the independent power supply Vs previously stored in the tenth capacitor Cpx, to charge the third capacitor Cbx via the second power switch Gxs. In this case, the second insulated switch Qx will be enabled according to the potential of the third capacitor Cbx. A control signal Sqx received by the control end of the second insulated switch Qx is shown in FIG. 18.

Referring to FIG. 9 and FIG. 8, during the enabling of the second insulated switch Qx, when the second insulated switch Qx is turned on, the independent power supply Vs, the first capacitor Cpu, and the second insulated switch Qx forms a pre-charging path. In the pre-charging path, the independent power supply Vs charges the first capacitor Cpu, that is, the charging current Ipu charges the first capacitor Cpu.

Figure 11:
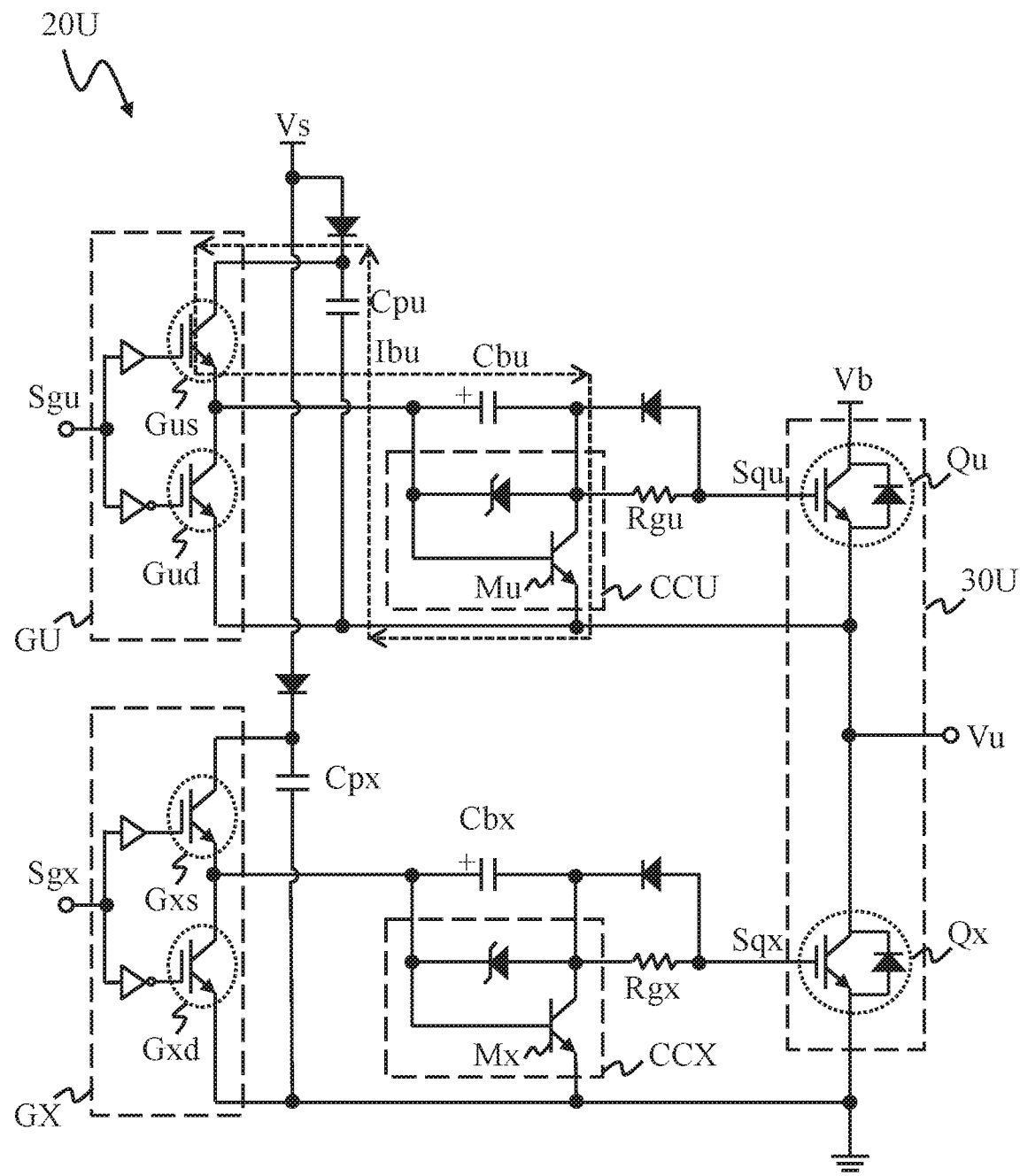
FIG. 11 is a schematic diagram of another example of the gate driving circuit of a first phase shown in FIG. 1 in a second charging phase.

Next, referring to FIG. 11 and FIG. 18, during a second charging phase P2, the first power switch Gus and the seventh power switch Gud are enabled synchronously and operate in complementary modes according to the PWM signal Sgu, that is, enabled respectively in response to the PWM signal Sgus and the PWM signal Sgud. The second power switch Gxs and the eighth power switch Gxd are disabled according to the PWM signal Sgx. When the first power switch Gus is turned on and the seventh power switch Gud is turned off, the charging switch Mu is turned on under the control of the independent power supply Vs (for example, a control signal Smu as shown in FIG. 18). At this point, the first capacitor Cpu, the first power switch Gus, the second capacitor Cbu, and the charging switch Mu form a charging loop (hereinafter referred to as a second charging path). In the second charging path, the first capacitor Cpu releases the independent power supply Vs previously stored in the first capacitor Cpu, to charge the second capacitor Cbu via the first power switch Gus. In this case, the first insulated switch Qu will be enabled according to the potential of the second capacitor Cbu. A control signal Squ received by the control end of the first insulated switch Qu is shown in FIG. 18.

Herein, during the pre-charging phase P0, the first charging phase P1 and the second charging phase P2, variations in the potential Vpu of the first capacitor Cpu, the potential Vbu of the second capacitor Cbu, the potential Vbx of the third capacitor Cbx, and the potential Vpx of the tenth capacitor Cpx are shown in FIG. 18.

The independent power supply Vs can provide the charging current via a diode. In other words, a diode can be forwardly connected in series between the independent power supply Vs and the first end of the first capacitor Cpu. In addition, a diode can be forwardly connected in series between the independent power supply Vs and the first end of the tenth capacitor Cpx.

Figure 12:
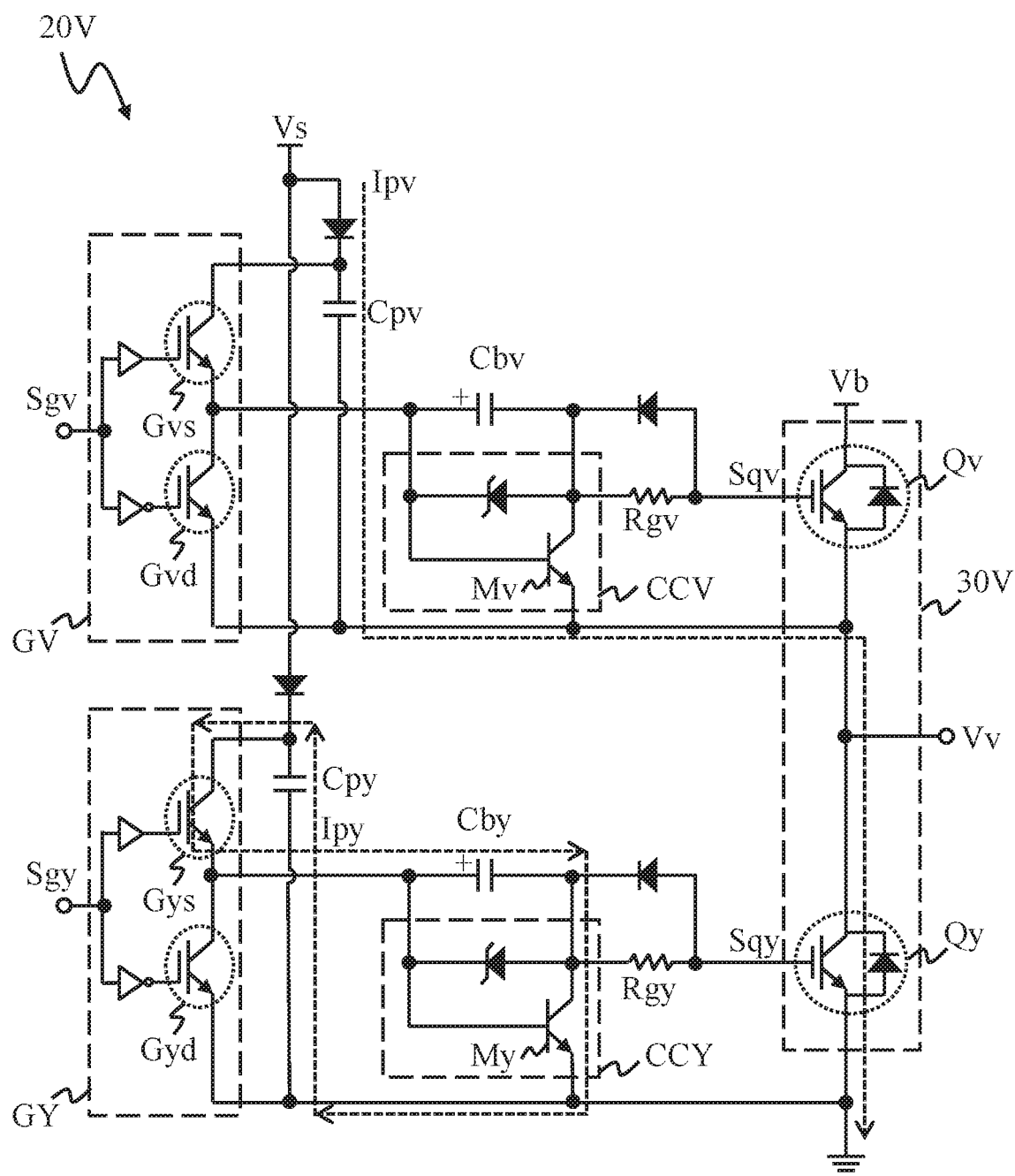
FIG. 12 is a schematic diagram of another example of the gate driving circuit of a second phase shown in FIG. 1 in a first charging phase.

In this example, referring to FIG. 12, the third bootstrap fast charging circuit CCV includes a charging switch Mv. In addition to the foregoing third power switch Gvs, the third isolation gate circuit GV further includes an additional upper arm power switch (hereinafter referred to as a ninth power switch Gvd). Here, the third power switch Gvs and the ninth power switch Gvd operate in complementary modes. The first end of the third power switch Gvs is electrically connected to the independent power supply Vs, the second end of the third power switch Gvs is electrically connected to a first end of the ninth power switch Gvd, and a second end of the ninth power switch Gvd is electrically connected to the second end of the third insulated switch Qv and the first end of the fourth insulated switch Qy. A control end of the charging switch Mv is electrically connected, via the third power switch Gvs, to the independent power supply Vs, that is, electrically connected to the second end of the third power switch Gvs and the second end of the ninth power switch Gvd. A first end of the charging switch Mv is electrically connected to the second end of the fifth capacitor Cbv, and a second end of the charging switch Mv is electrically connected to the second end of the third insulated switch Qv and the first end of the fourth insulated switch Qy. The first end of the fifth capacitor Cbv is also electrically connected to the second end of the third power switch Gvs and the second end of the ninth power switch Gvd.

The fourth bootstrap fast charging circuit CCY includes a charging switch My. In addition to the foregoing fourth power switch Gys, the fourth isolation gate circuit GY further includes an additional upper arm power switch (hereinafter referred to as a tenth power switch Gyd). Herein, the fourth power switch Gys and the tenth power switch Gyd operate in complementary modes. The first end of the fourth power switch Gys is electrically connected to the independent power supply Vs, the second end of the fourth power switch Gys is electrically connected to a first end of the tenth power switch Gyd, and a second end of the tenth power switch Gyd is electrically connected to the second end of the fourth insulated switch Qy and ground. A control end of the charging switch My is electrically connected, via the fourth power switch Gys, to the independent power supply Vs, that is, electrically connected to the second end of the fourth power switch Gys and the second end of the tenth power switch Gyd. A first end of the charging switch My is electrically connected to the second end of the sixth capacitor Cby, and a second end of the charging switch My is electrically connected to the second end of the fourth insulated switch Qy and ground. The first end of the sixth capacitor Cby is also electrically connected to the second end of the fourth power switch Gys and the second end of the ninth power switch Gvd.

During action, the third power switch Gvs is controlled by the PWM signal Sgv, and the ninth power switch Gvd is controlled by the inverted PWM signal Sgv. The fourth power switch Gys is controlled by the PWM signal Sgy, and the tenth power switch Gyd is controlled by the inverted PWM signal Sgy. In an example, the control end of the third power switch Gvs receives a PWM signal Sgv delayed by a buffer gate, that is, the PWM signal Sgvs as shown in FIG. 18. A control end of the ninth power switch Gvd receives a PWM signal Sgv inverted by an inverter, that is, the PWM signal Sgvd as shown in FIG. 18. The control end of the fourth power switch Gys receives a PWM signal Sgy delayed by a buffer gate, that is, the PWM signal Sgys as shown in FIG. 18. A control end of the tenth power switch Gyd receives a PWM signal Sgy inverted by an inverter, that is, the PWM signal Sgyd as shown in FIG. 18.

Figure 13:
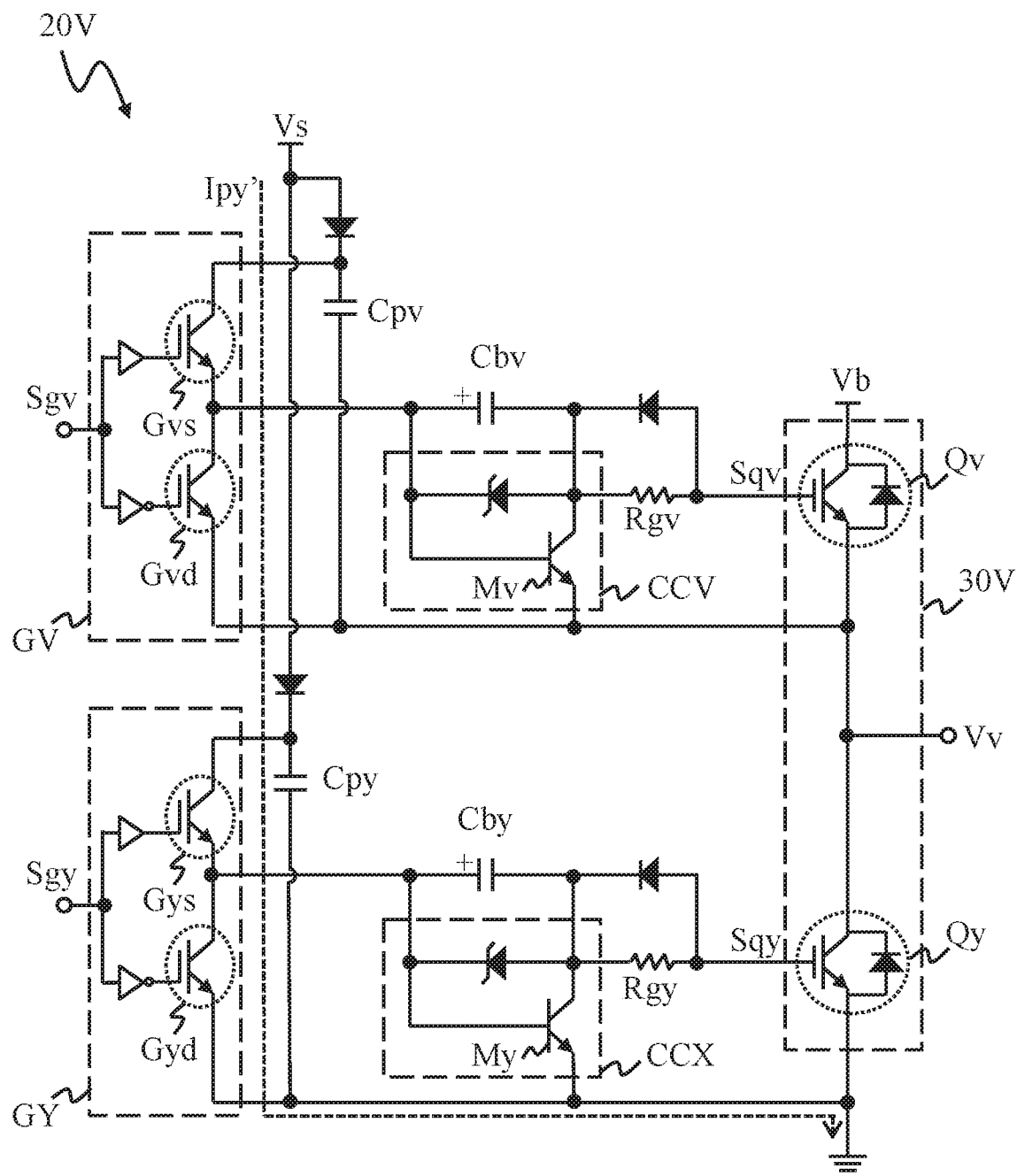
FIG. 13 is a schematic diagram of another example of the gate driving circuit of a second phase shown in FIG. 1 in a pre-charging phase.

Referring to FIG. 12 and FIG. 18, during the first charging phase P1, the fourth power switch Gys and the tenth power switch Gyd are enabled synchronously and operate in complementary modes according to the PWM signal Sgy, that is, enabled respectively in response to the PWM signal Sgys and the PWM signal Sgyd. The third power switch Gvs and the ninth power switch Gvd are disabled according to the PWM signal Sgv. When the fourth power switch Gys is turned on and the tenth power switch Gyd is turned off, the charging switch My is turned on under the control of the independent power supply Vs (for example, a control signal Smy as shown in FIG. 18), so that the independent power supply Vs charges the sixth capacitor Cby, that is, the charging current Ipy charges the sixth capacitor Cby, thereby enabling the fourth insulated switch Qy. In some embodiments, the lower arm driving circuit may further include a lower arm pre-charging capacitor (hereinafter referred to as an eleventh capacitor Cpy), and the eleventh capacitor Cpy is electrically connected between the independent power supply Vs and ground, that is, connected in parallel with the fourth isolation gate circuit GY. Before the first charging phase P1, that is, during the pre-charging phase P0, the independent power supply Vs precharges the eleventh capacitor Cpy, that is, the charging current Ipy' charges the eleventh capacitor Cpy, as shown in FIG. 13. Subsequently, during the first charging phase P1, when the fourth power switch Gys is turned on and the tenth power switch Gyd is turned off, the charging switch My is turned on under the control of the independent power supply Vs. At this point, the eleventh capacitor Cpy, the fourth power switch Gys, the sixth capacitor Cby, and the charging switch My form a charging loop (hereinafter referred to as a first charging path). In the first charging path, the eleventh capacitor Cpy releases the independent power supply Vs previously stored in the eleventh capacitor Cpy, to charge the sixth capacitor Cby via the fourth power switch Gys. In this case, the fourth insulated switch Qy will be enabled depending on the potential of the sixth capacitor Cby. A control signal Sqy received by the control end of the fourth insulated switch Qy is shown in FIG. 18.

Referring to FIG. 12 and FIG. 18, during the enabling of the fourth insulated switch Qy, when the fourth insulated switch Qy is turned on, the independent power supply Vs, the fourth capacitor Cpv, and the fourth insulated switch Qy forms a pre-charging path. In the pre-charging path, the independent power supply Vs charges the fourth capacitor Cpv, that is, the charging current Ipv charges the fourth capacitor Cpv.

Figure 14:
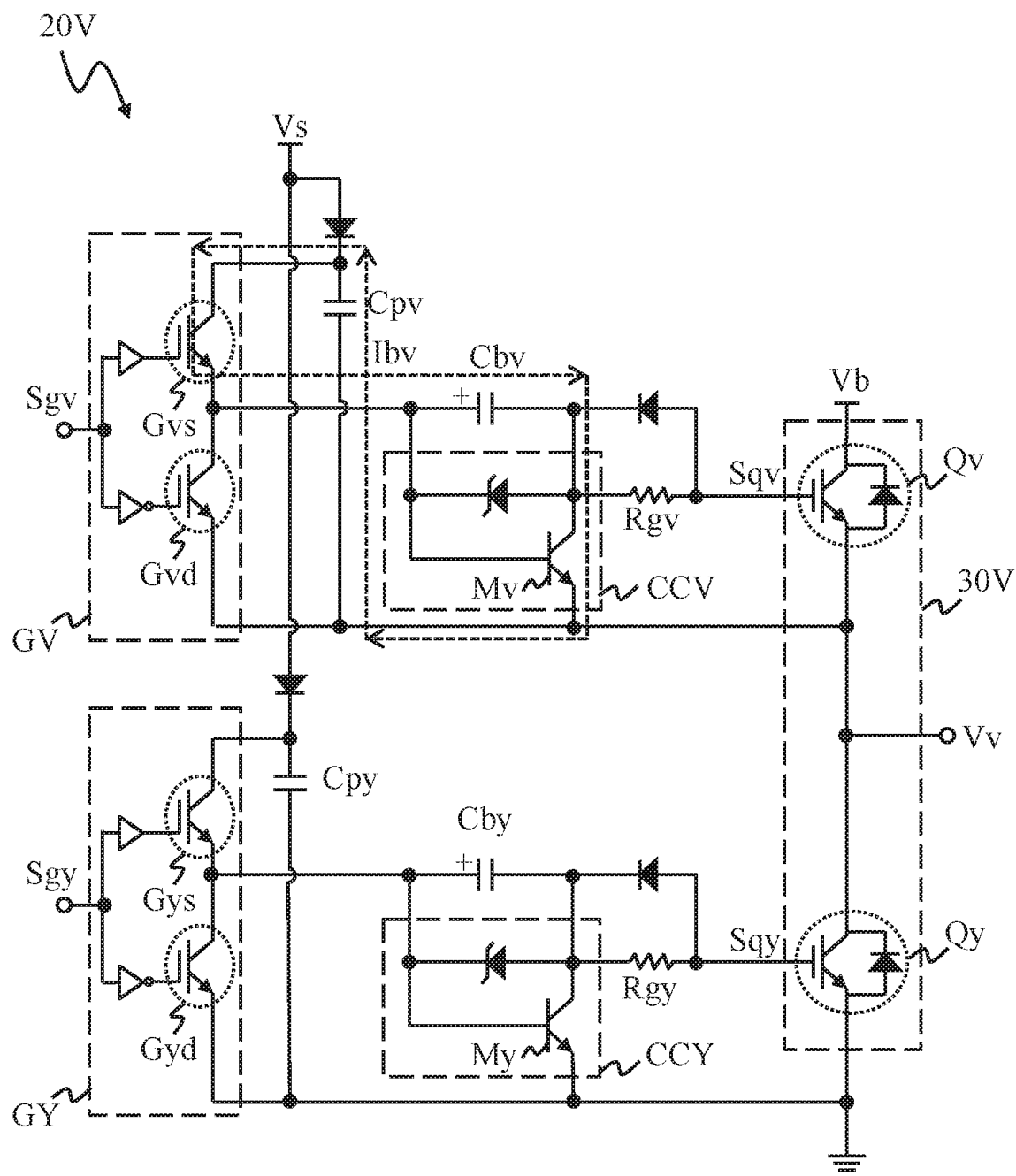
FIG. 14 is a schematic diagram of another example of the gate driving circuit of a second phase shown in FIG. 1 in a second charging phase.

Next, referring to FIG. 14 and FIG. 18, during the second charging phase P2, the third power switch Gvs and the ninth power switch Gvd are enabled synchronously and operate in complementary modes according to the PWM signal Sgv, that is, enabled respectively in response to the PWM signal Sgvs and the PWM signal Sgvd. The fourth power switch Gys and the tenth power switch Gyd are disabled according to the PWM signal Sgy. When the third power switch Gvs is turned on and the ninth power switch Gvd is turned off, the charging switch Mv is turned on under the control of the independent power supply Vs (for example, a control signal Smy as shown in FIG. 18). At this point, the fourth capacitor Cpv, the third power switch Gvs, the fifth capacitor Cbv, and the charging switch Mv form a charging loop (hereinafter referred to as a second charging path). In the second charging path, the fourth capacitor Cpv releases the independent power supply Vs previously stored in the fourth capacitor Cpv, to charge the fifth capacitor Cbv via the third power switch Gvs. In this case, the third insulated switch Qv will be enabled according to the potential of the fifth capacitor Cbv. A control signal Sqv received by the control end of the third insulated switch Qv is shown in FIG. 18.

Herein, during the pre-charging phase P0, the first charging phase P1 and the second charging phase P2, variations in the potential Vpv of the fourth capacitor Cpv, the potential Vbv of the fifth capacitor Cbv, the potential Vby of the sixth capacitor Cby, and the potential Vpy of the eleventh capacitor Cpy are shown in FIG. 18.

The independent power supply Vs can provide the charging current via a diode. In other words, a diode can be forwardly connected in series between the independent power supply Vs and the first end of the fourth capacitor Cpv. In addition, a diode can be forwardly connected in series between the independent power supply Vs and the first end of the eleventh capacitor Cpy.

Figure 15:
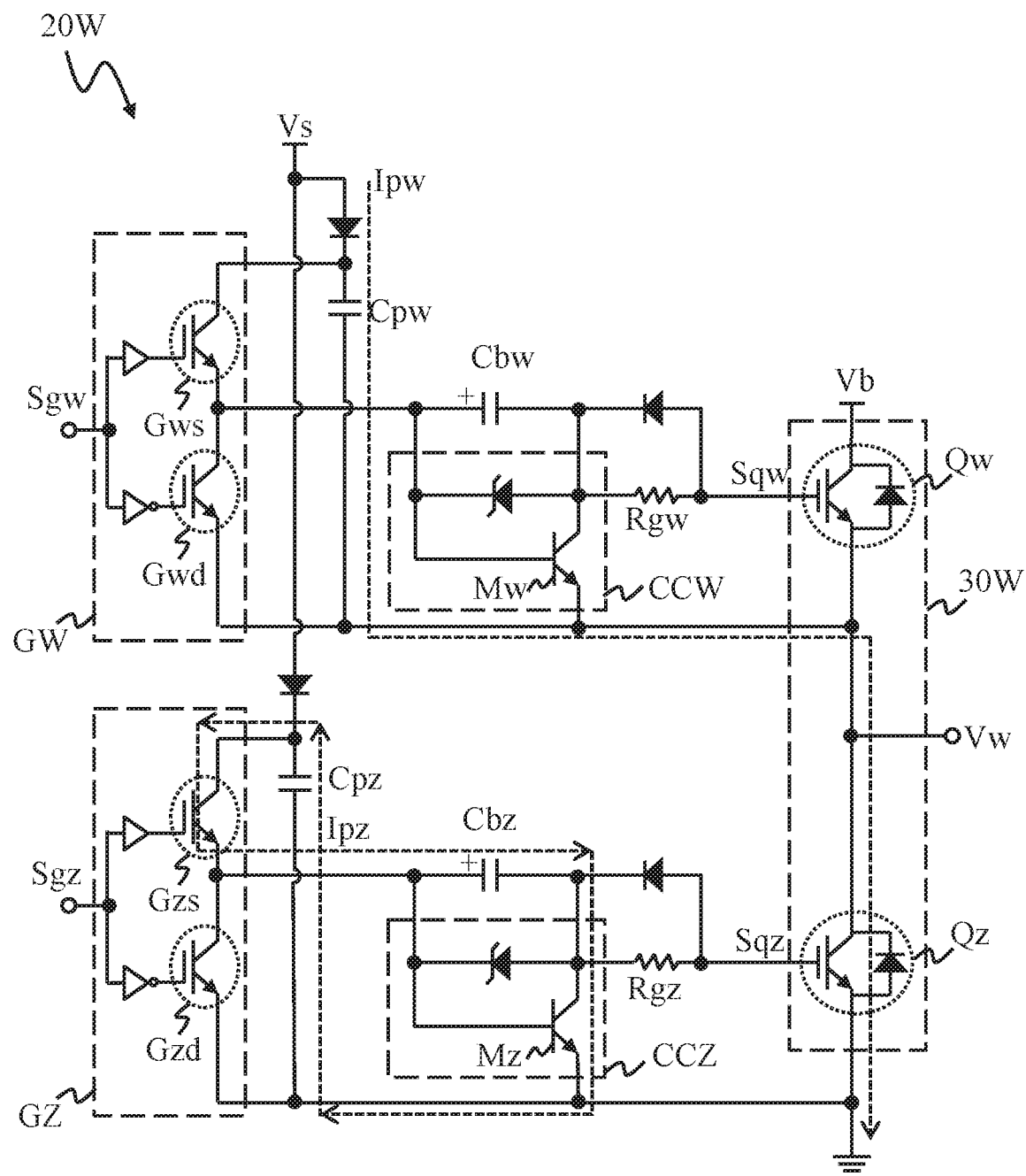
FIG. 15 is a schematic diagram of another example of the gate driving circuit of a third phase shown in FIG. 1 in a first charging phase.

In this example, referring to FIG. 15, the fifth bootstrap fast charging circuit CCW includes a charging switch Mw. In addition to the foregoing fifth power switch Gws, the fifth isolation gate circuit GW further includes an additional upper arm power switch (hereinafter referred to as an eleventh power switch Gwd). Here, the fifth power switch Gws and the eleventh power switch Gwd operate in complementary modes. The first end of the fifth power switch Gws is electrically connected to the independent power supply Vs, the second end of the fifth power switch Gws is electrically connected to a first end of the eleventh power switch Gwd, and a second end of the eleventh power switch Gwd is electrically connected to the second end of the fifth insulated switch Qw and the first end of the sixth insulated switch Qz. A control end of the charging switch Mw is electrically connected, via the fifth power switch Gws, to the independent power supply Vs, that is, electrically connected to the second end of the fifth power switch Gws and the second end of the eleventh power switch Gwd. A first end of the charging switch Mw is electrically connected to the second end of the eighth capacitor Cbw, and a second end of the charging switch Mw is electrically connected to the second end of the fifth insulated switch Qw and the first end of the sixth insulated switch Qz. The first end of the eighth capacitor Cbw is also electrically connected to the second end of the fifth power switch Gws and the second end of the eleventh power switch Gwd.

The sixth bootstrap fast charging circuit CCZ includes a charging switch Mz. In addition to the foregoing sixth power switch Gzs, the sixth isolation gate circuit GZ further includes an additional upper arm power switch (hereinafter referred to as a twelfth power switch Gzd). Herein, the sixth power switch Gzs and the twelfth power switch Gzd operate in complementary modes. The first end of the sixth power switch Gzs is electrically connected to the independent power supply Vs, the second end of the sixth power switch Gzs is electrically connected to a first end of the twelfth power switch Gzd, and a second end of the twelfth power switch Gzd is electrically connected to the second end of the sixth insulated switch Qz and ground. A control end of the charging switch Mz is electrically connected, via the sixth power switch Gzs, to the independent power supply Vs, that is, electrically connected to the second end of the sixth power switch Gzs and the second end of the twelfth power switch Gzd. A first end of the charging switch Mw is electrically connected to the second end of the ninth capacitor Cbz, and a second end of the charging switch Mz is electrically connected to the second end of the sixth insulated switch Qz and ground. The first end of the ninth capacitor Cbz is also electrically connected to the second end of the sixth power switch Gzs and the second end of the eleventh power switch Gwd.

During action, the fifth power switch Gws is controlled by the PWM signal Sgw, and the eleventh power switch Gwd is controlled by the inverted PWM signal Sgw. The sixth power switch Gzs is controlled by the PWM signal Sgz, and the twelfth power switch Gzd is controlled by the inverted PWM signal Sgz. In an example, the control end of the fifth power switch Gws receives a PWM signal Sgw delayed by a buffer gate, that is, the PWM signal Sgws as shown in FIG. 18. A control end of the eleventh power switch Gwd receives a PWM signal Sgw inverted by an inverter, that is, the PWM signal Sgwd as shown in FIG. 18. The control end of the sixth power switch Gzs receives a PWM signal Sgz delayed by a buffer gate, that is, the PWM signal Sgzs as shown in FIG. 18. A control end of the twelfth power switch Gzd receives a PWM signal Sgz inverted by an inverter, that is, the PWM signal Sgzd as shown in FIG. 18.

Figure 16:
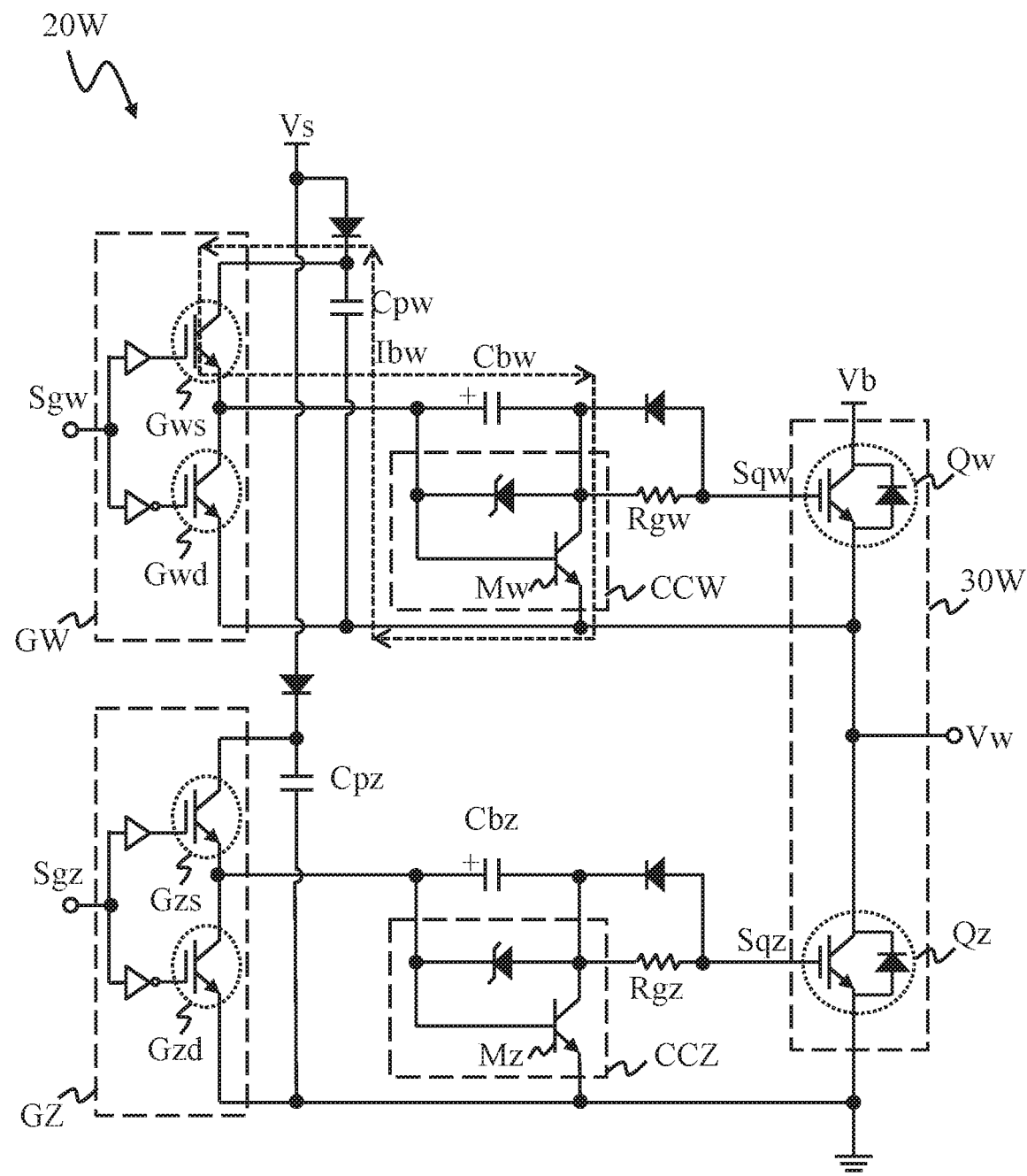
FIG. 16 is a schematic diagram of another example of the gate driving circuit of a third phase shown in FIG. 1 in a pre-charging phase.

Referring to FIG. 15 and FIG. 18, during the first charging phase P1, the sixth power switch Gzs and the twelfth power switch Gzd are enabled synchronously and operate in complementary modes according to the PWM signal Sgz, that is, enabled respectively in response to the PWM signal Sgzs and the PWM signal Sgzd. The fifth power switch Gws and the eleventh power switch Gwd are disabled according to the PWM signal Sgw. When the sixth power switch Gzs is turned on and the twelfth power switch Gzd is turned off, the charging switch Mz is turned on under the control of the independent power supply Vs (for example, a control signal Smz as shown in FIG. 18), so that the independent power supply Vs charges the ninth capacitor Cbz, that is, the charging current Ipz charges the ninth capacitor Cbz, thereby enabling the sixth insulated switch Qz. In some embodiments, the lower arm driving circuit may further include a lower arm pre-charging capacitor (hereinafter referred to as a twelfth capacitor Cpz), and the twelfth capacitor Cpz is electrically connected between the independent power supply Vs and ground, that is, connected in parallel with the sixth isolation gate circuit GZ. Before the first charging phase P1, that is, during the pre-charging phase P0, the independent power supply Vs precharges the twelfth capacitor Cpz, that is, a charging current Ipz' charges the twelfth capacitor Cpz, as shown in FIG. 16. Subsequently, during the first charging phase P1, when the sixth power switch Gzs is turned on and the twelfth power switch Gzd is turned off, the charging switch Mz is turned on under the control of the independent power supply Vs. At this point, the twelfth capacitor Cpz, the sixth power switch Gzs, the ninth capacitor Cbz, and the charging switch Mz form a charging loop (hereinafter referred to as a first charging path). In the first charging path, the twelfth capacitor Cpz releases the independent power supply Vs previously stored in the twelfth capacitor Cpz, to charge the ninth capacitor Cbz via the sixth power switch Gzs. In this case, the sixth insulated switch Qz will be enabled according to the potential of the ninth capacitor Cbz. A control signal Sqz received by the control end of the sixth insulated switch Qz is shown in FIG. 18.

Referring to FIG. 15 and FIG. 18, during the enabling of the sixth insulated switch Qz, when the sixth insulated switch Qz is turned on, the independent power supply Vs, the seventh capacitor Cpw, and the sixth insulated switch Qz forms a pre-charging path. In the pre-charging path, the independent power supply Vs charges the seventh capacitor Cpw, that is, the charging current Ipw charges the seventh capacitor Cpw.

Figure 17:
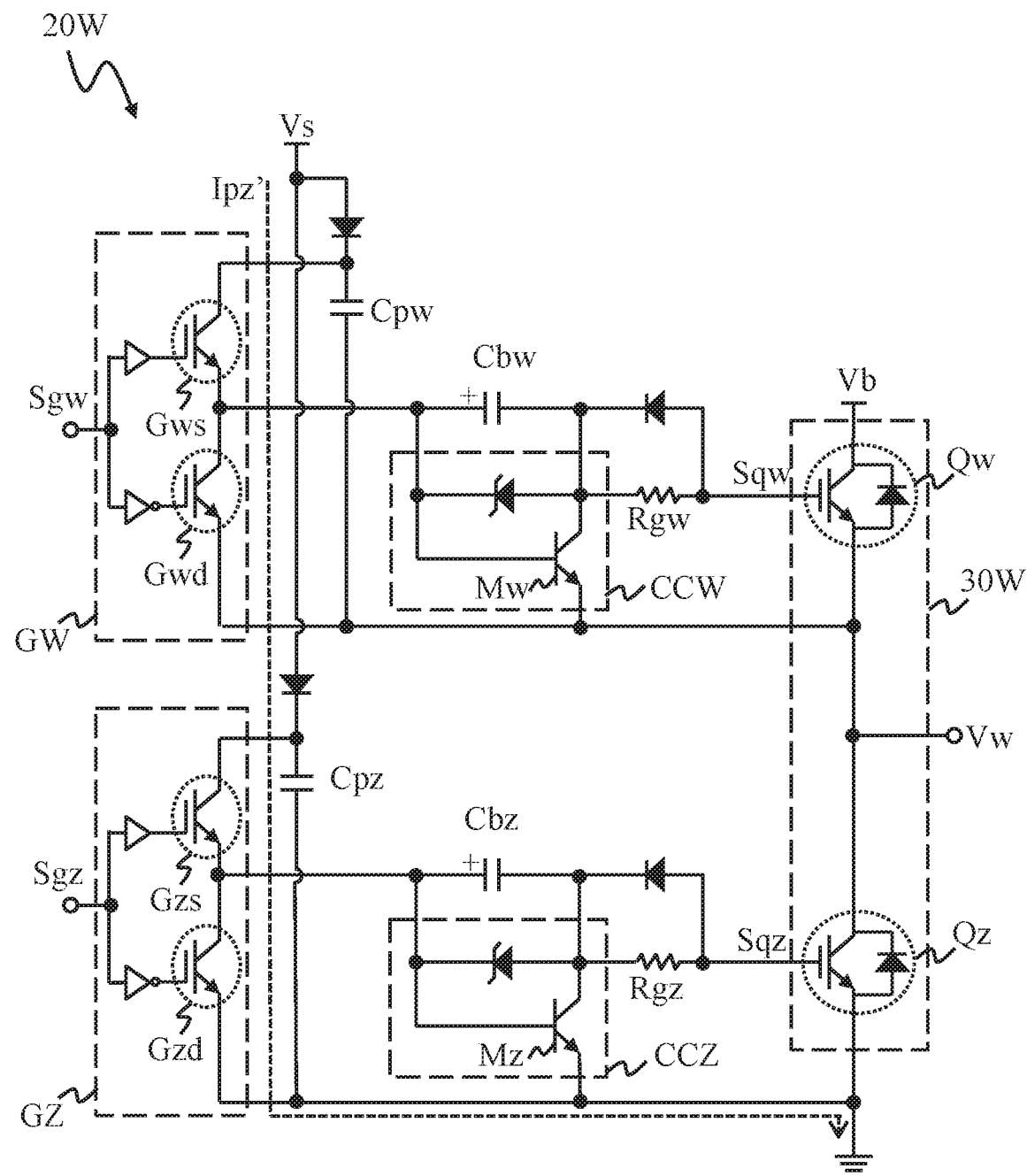
FIG. 17 is a schematic diagram of another example of the gate driving circuit of a third phase shown in FIG. 1 in to second charging phase.

Next, referring to FIG. 17 and FIG. 18, during the second charging phase P2, the fifth power switch Gws and the eleventh power switch Gwd are enabled synchronously and operate in complementary modes according to the PWM signal Sgw, that is, enabled respectively in response to the PWM signal Sgws and the PWM signal Sgwd. The sixth power switch Gzs and the twelfth power switch Gzd are disabled according to the PWM signal Sgz. When the fifth power switch Gws is turned on and the eleventh power switch Gwd is turned off, the charging switch Mw is turned on under the control of the independent power supply Vs (a control signal Smw as shown in FIG. 18). At this point, the seventh capacitor Cpw, the fifth power switch Gws, the eighth capacitor Cbw, and the charging switch Mw form a charging loop (hereinafter referred to as a second charging path). In the second charging path, the seventh capacitor Cpw releases the independent power supply Vs previously stored in the seventh capacitor Cpw, to charge the eighth capacitor Cbw via the fifth power switch Gws. In this case, the fifth insulated switch Qw will be enabled according to the potential of the eighth capacitor Cbw. A control signal Sqw received by the control end of the fifth insulated switch Qw is shown in FIG. 18.

Herein, during the pre-charging phase P0, the first charging phase P1, and the second charging phase P2, variations in the potential Vpw of the seventh capacitor Cp, the potential Vbw of the eighth capacitor Cbw, the potential Vbz of the ninth capacitor Cbz, and the potential Vpz of the twelfth capacitor Cpz are shown in FIG. 18.

The independent power supply Vs can provide the charging current via a diode. In other words, a diode can be forwardly connected in series between the independent power supply Vs and the first end of the seventh capacitor Cpw. In addition, a diode can be forwardly connected in series between the independent power supply Vs and the first end of the twelfth capacitor Cpz.

In some embodiments, the gate driving circuits 20U, 20V, and 20W of different phases can operate synchronously. In other words, during the first charging phase P1, the second power switch Gxs, the fourth power switch Gys, and the sixth power switch Gzs are enabled simultaneously. During the enabling process, the second power switch Gxs, the fourth power switch Gys, and the sixth power switch Gzs are turned on simultaneously, which occurs alternatively with a fact that the second power switch Gxs, the fourth power switch Gys, and the sixth power switch Gzs are turned off simultaneously. Similarly, during the first charging phase P2, the first power switch Gus, the third power switch Gvs and the fifth power switch Gws are enabled simultaneously. During the enabling process, the first power switch Gus, the third power switch Gvs and the fifth power switch Gws are turned off simultaneously, which occurs alternatively with a fact that the first power switch Gus, the third power switch Gvs and the fifth power switch Gws are turned off simultaneously.

Figure 19:
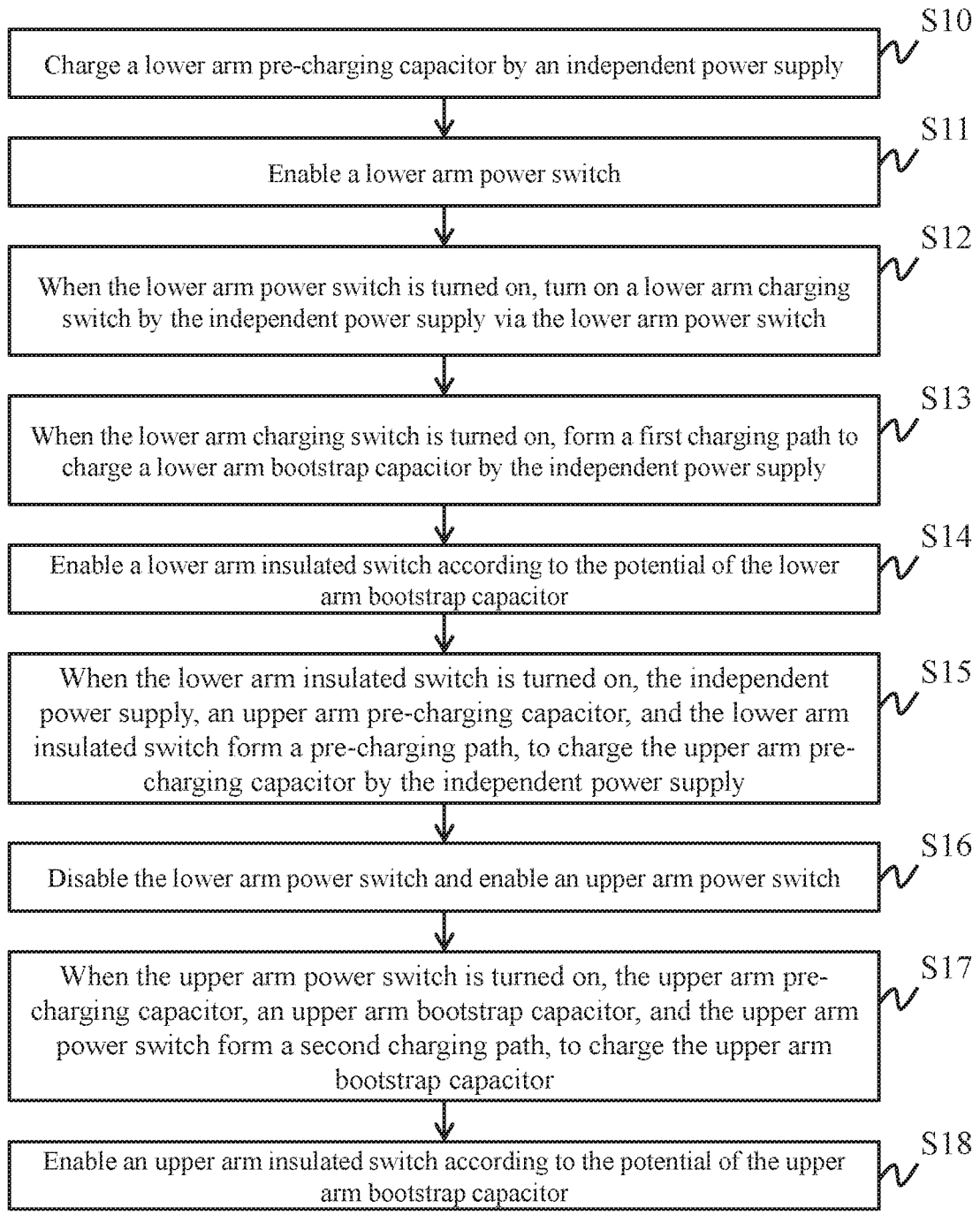
FIG. 19 is a flowchart of a gate driving method according to an embodiment.

It can be known from the above description, the present invention further provides a gate driving method. In an embodiment, referring to FIG. 19, the gate driving method includes the following steps. First, a lower arm power switch is enabled (Step S11). During the enabling of the lower arm power switch, when the lower arm power switch is turned on, a lower arm charging switch is turned on by an independent power supply via the lower arm power switch (Step S12). When the lower arm charging switch is turned on, a first charging path is formed to charge a lower arm bootstrap capacitor by the independent power supply (Step S13). The first charging path includes the lower arm bootstrap capacitor and the lower arm charging switch. In this case, a lower arm insulated switch will be enabled according to the potential of the lower arm bootstrap capacitor (Step S14). During the enabling of the lower arm insulated switch, when the lower arm insulated switch is turned on, the independent power supply, an upper arm pre-charging capacitor, and the lower arm insulated switch form a pre-charging path, to charge the upper arm pre-charging capacitor by the independent power supply (Step S15). After the step of enabling the lower arm insulated switch, the lower arm power switch is disabled, and an upper arm power switch is enabled (Step S16). When the upper arm power switch is turned on, the upper arm pre-charging capacitor, an upper arm bootstrap capacitor, and the upper arm power switch form a second charging path, to charge the upper arm bootstrap capacitor (Step S17). In this case, an upper arm insulated switch will be enabled according to the potential of the upper arm bootstrap capacitor (Step S18).

In some embodiments, before the step of enabling the lower arm power switch (Step S11), a lower arm pre-charging capacitor is charged by the independent power supply (Step S10). In this case, the step of turning on a lower arm charging switch by the independent power supply via the lower arm power switch (Step S12) includes: releasing, by the lower arm pre-charging capacitor, the stored independent power supply to a control end of the lower arm charging switch. In this case, the first charging path further includes the lower arm pre-charging capacitor.

In some embodiments, the foregoing upper arm insulated switch and the lower arm insulated switch may be implemented as an insulated gate bipolar transistor (IGBT). The foregoing upper arm power switch and the lower arm power switch may be implemented as a transistor. The foregoing charging switch may be implemented as a transistor.

In summary, the gate driving circuit applied to a motor inverter and gate driving method according to any embodiment of the present invention are applicable to the motor inverter 10, and can drive the switch circuit 30 by the independent power supply Vs.

What is claimed is:

1. A gate driving circuit applied to a motor inverter, comprising:
    a first power switch circuit, having a first power switch and a second power switch;
    a first bootstrap fast charging circuit, electrically connected to the first power switch;
    a second bootstrap fast charging circuit, electrically connected to the second power switch;
    a first capacitor, electrically connected to the first power switch;
    a second capacitor, electrically connected to the first bootstrap fast charging circuit and a first insulated switch; and
    a third capacitor, electrically connected to the second bootstrap fast charging circuit and a second insulated switch; wherein
    when the first power switch is disabled and the second power switch is enabled, an independent power supply enables the second bootstrap fast charging circuit to charge the third capacitor to enable the second insulated switch.

2. The gate driving circuit according to claim 1, wherein when the second insulated switch is turned on, the independent power supply charges the first capacitor.

3. The gate driving circuit according to claim 2, wherein when the first power switch is enabled and the second power switch is disabled, the independent power supply enables, via the first capacitor, the first bootstrap fast charging circuit to charge the second capacitor, to enable the first insulated switch.

4. The gate driving circuit according to claim 1, wherein the first bootstrap fast charging circuit comprises:
    a charging switch, wherein a control end of the charging switch is electrically connected, via the first power switch, to the independent power supply, a first end of the charging switch is electrically connected to the second capacitor, and a second end of the charging switch is electrically connected to the second insulated switch.

5. The gate driving circuit according to claim 1, wherein the second bootstrap fast charging circuit comprises:
    a charging switch, wherein a control end of the charging switch is electrically connected, via the second power switch, to the independent power supply, a first end of the charging switch is electrically connected to the third capacitor, and a second end of the charging switch is electrically connected to ground.

6. The gate driving circuit according to claim 1, further comprising:
   a second power switch circuit, having a third power switch and a fourth power switch;
   a third bootstrap fast charging circuit, electrically connected to the third power switch;
   a fourth bootstrap fast charging circuit, electrically connected to the fourth power switch;
   a fourth capacitor, electrically connected to the third power switch;
   a fifth capacitor, electrically connected to the third bootstrap fast charging circuit and a third insulated switch; and
   a sixth capacitor, electrically connected to the fourth bootstrap fast charging circuit and a fourth insulated switch; wherein
   when the third power switch is disabled and the fourth power switch is enabled, the independent power supply enables the fourth bootstrap fast charging circuit to charge the sixth capacitor to enable the fourth insulated switch.

7. The gate driving circuit according to claim 6, wherein when the fourth insulated switch is turned on, the independent power supply charges the fourth capacitor.

8. The gate driving circuit according to claim 7, wherein when the third power switch is enabled and the fourth power switch is disabled, the independent power supply enables, via the fourth capacitor, the third bootstrap fast charging circuit to charge the fifth capacitor to enable the third insulated switch.

9. The gate driving circuit according to claim 6, wherein the third bootstrap fast charging circuit comprises:
   a charging switch, wherein a control end of the charging switch is electrically connected, via the third power switch, to the independent power supply, a first end of the charging switch is electrically connected to the fifth capacitor, and a second end of the charging switch is electrically connected to the fourth insulated switch.

10. The gate driving circuit according to claim 6, wherein the fourth bootstrap fast charging circuit comprises:
    a charging switch, wherein a control end of the charging switch is electrically connected, via the fourth power switch, to the independent power supply, a first end of the charging switch is electrically connected to the sixth capacitor, and a second end of the charging switch is electrically connected to ground.

11. The gate driving circuit according to claim 6, further comprising:
    a third power switch circuit, having a fifth power switch and a sixth power switch;
    a fifth bootstrap fast charging circuit, electrically connected to the fifth power switch;
    a sixth bootstrap fast charging circuit, electrically connected to the sixth power switch;
    a seventh capacitor, electrically connected to the fifth power switch;
    an eighth capacitor, electrically connected to the fifth bootstrap fast charging circuit and a fifth insulated switch; and
    a ninth capacitor, electrically connected to the sixth bootstrap fast charging circuit and a sixth insulated switch; wherein
    when the fifth power switch is disabled and the sixth power switch is enabled, the independent power supply enables the sixth bootstrap fast charging circuit to charge the ninth capacitor to enable the sixth insulated switch.

12. The gate driving circuit according to claim 11, wherein the second power switch, the fourth power switch, and the sixth power switch are enabled simultaneously; and during the enabling process, the second power switch, the fourth power switch and the sixth power switch are turned on simultaneously which occurs alternatively with a fact that the second power switch, the fourth power switch, and the sixth power switch are turned off simultaneously.

13. The gate driving circuit according to claim 1, further comprising:
    a third power switch circuit, having a fifth power switch and a sixth power switch;
    a fifth bootstrap fast charging circuit, electrically connected to the fifth power switch;
    a sixth bootstrap fast charging circuit, electrically connected to the sixth power switch;
    a seventh capacitor, electrically connected to the fifth power switch;
    an eighth capacitor, electrically connected to the fifth bootstrap fast charging circuit and a fifth insulated switch; and
    a ninth capacitor, electrically connected to the sixth bootstrap fast charging circuit and a sixth insulated switch; wherein
    when the fifth power switch is disabled and the sixth power switch is enabled, the independent power supply enables the sixth bootstrap fast charging circuit to charge the ninth capacitor to enable the sixth insulated switch.

14. The gate driving circuit according to claim 13, wherein when the sixth insulated switch is turned on, the independent power supply charges the seventh capacitor.

15. The gate driving circuit according to claim 14, wherein when the fifth power switch is turned on and the sixth power switch is turned off, the independent power supply enables, via the seventh capacitor, the fifth bootstrap fast charging circuit to charge the eighth capacitor to enable the fifth insulated switch.

16. The gate driving circuit according to claim 13, wherein the fifth bootstrap fast charging circuit comprises:
    a charging switch, wherein a control end of the charging switch is electrically connected, via the fifth power switch, to the independent power supply, a first end of the charging switch is electrically connected to the eighth capacitor, and a second end of the charging switch is electrically connected to the sixth insulated switch.

17. The gate driving circuit according to claim 13, wherein the sixth bootstrap fast charging circuit comprises
    a charging switch, wherein a control end of the charging switch is electrically connected, via the sixth power switch, to the independent power supply, a first end of the charging switch is electrically connected to the ninth capacitor, and a second end of the charging switch is electrically connected to ground.

18. A gate driving method, comprising:
    enabling a lower arm power switch;
    when the lower arm power switch is turned on, turning on a lower arm charging switch by an independent power supply via the lower arm power switch;
    when the lower arm charging switch is turned on, a first charging path being formed to charge a lower arm bootstrap capacitor by the independent power supply, wherein the first charging path comprises the lower arm bootstrap capacitor and the lower arm charging switch;

enabling a lower arm insulated switch according to the potential of the lower arm bootstrap capacitor;

when the lower arm insulated switch is turned on, the independent power supply, an upper arm pre-charging capacitor and the lower arm insulated switch forming a pre-charging path, to charge the upper arm pre-charging capacitor by the independent power supply;

after the step of enabling the lower arm insulated switch, disabling the lower arm power switch and enabling an upper arm power switch;

when the upper arm power switch is turned on, the upper arm pre-charging capacitor, an upper arm bootstrap capacitor and the upper arm power switch forming a second charging path, to charge the upper arm bootstrap capacitor; and enabling an upper arm insulated switch according to the potential of the upper arm bootstrap capacitor.

19. The gate driving method according to claim 18, further comprising:

before the step of enabling the lower arm power switch, charging a lower arm pre-charging capacitor by the independent power supply, wherein the step of turning on a lower arm charging switch by the independent power supply via the lower arm power switch comprises: releasing, by the lower arm pre-charging capacitor, the stored independent power supply to a control end of the lower arm charging switch, and wherein the first charging path further comprises the lower arm pre-charging capacitor.

* * * * *